US012426447B2

(12) United States Patent
Cho et al.

(10) Patent No.: US 12,426,447 B2
(45) Date of Patent: Sep. 23, 2025

(54) DISPLAY DEVICE WITH MULTILAYER DAMS

(71) Applicant: Samsung Display Co., Ltd., Yongin-si (KR)

(72) Inventors: Youngjin Cho, Yongin-si (KR); Jisu Na, Yongin-si (KR); Joongsoo Moon, Yongin-si (KR); Juncheol Shin, Yongin-si (KR); Byeongguk Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 772 days.

(21) Appl. No.: 17/305,419

(22) Filed: Jul. 7, 2021

(65) Prior Publication Data

US 2022/0020833 A1    Jan. 20, 2022

(30) Foreign Application Priority Data

Jul. 17, 2020  (KR) ........................ 10-2020-0089155

(51) Int. Cl.
*H10K 59/124* (2023.01)
*H10K 59/122* (2023.01)
*H10K 59/131* (2023.01)
*H10K 59/40* (2023.01)
*H10K 59/80* (2023.01)
*G06F 3/041* (2006.01)
(Continued)

(52) U.S. Cl.
CPC ......... *H10K 59/124* (2023.02); *H10K 59/122* (2023.02); *H10K 59/131* (2023.02);
(Continued)

(58) Field of Classification Search
CPC .... H10K 59/124; H10K 59/131; H10K 59/40; H10K 59/122; H10K 50/844; H10K 2102/341; G06F 3/0446; G06F 3/0412
See application file for complete search history.

(56) References Cited

U.S. PATENT DOCUMENTS 9,601,717 B2   3/2017 Lee et al.
9,991,462 B2   6/2018 Park et al.
(Continued)

FOREIGN PATENT DOCUMENTS

EP        3 644 369 A2   4/2020
KR   10-2018-0025104 A   3/2018
(Continued)

*Primary Examiner* — Lex H Malsawma
(74) *Attorney, Agent, or Firm* — Womble Bond Dickinson (US) LLP

(57) ABSTRACT

A display device includes a display area and a peripheral area surrounding the display area, a thin film transistor in the display area, a first insulating layer, the first insulating layer covering the thin film transistor, a signal line on the first insulating layer, the signal line being coupled to the thin film transistor, a second insulating layer on the first insulating layer, the second insulating layer covering the signal line, a power supply line in the peripheral area, the power supply line configured to supply power to a pixel circuit including the thin film transistor, and a first dam including a multilayer structure on the power supply line and overlapping at least a part of the power supply line, in which multilayer structure including a lowermost layer including the same material as the second insulating layer, and the lowermost layer is above the power supply line.

22 Claims, 16 Drawing Sheets

(51) Int. Cl.
*G06F 3/044* (2006.01)
*H10K 50/844* (2023.01)
*H10K 102/00* (2023.01)

(52) U.S. Cl.
CPC ......... *H10K 59/40* (2023.02); *H10K 59/8731* (2023.02); *G06F 3/0412* (2013.01); *G06F 3/0446* (2019.05); *H10K 50/844* (2023.02); *H10K 59/8722* (2023.02); *H10K 2102/341* (2023.02)

(56) References Cited

U.S. PATENT DOCUMENTS

| | | | |
|---|---|---|---|
| 10,559,772 B2* | 2/2020 | Ochi | H10K 50/125 |
| 2015/0014647 A1* | 1/2015 | Cho | H10K 50/8428 257/40 |
| 2017/0331058 A1 | 11/2017 | Seo et al. | |
| 2019/0019966 A1* | 1/2019 | Jiang | H10K 59/124 |
| 2019/0221634 A1 | 7/2019 | Kim et al. | |
| 2019/0229175 A1 | 7/2019 | Lhee et al. | |
| 2020/0083306 A1* | 3/2020 | Choi | H10K 50/84 |
| 2020/0083314 A1 | 3/2020 | Choi et al. | |
| 2020/0127220 A1* | 4/2020 | Kim | H10K 50/11 |
| 2020/0185647 A1* | 6/2020 | Lee | H10K 59/122 |

FOREIGN PATENT DOCUMENTS

| | | |
|---|---|---|
| KR | 10-2018-0054386 A | 5/2018 |
| KR | 10-1926582 B1 | 12/2018 |
| KR | 10-2063598 B1 | 1/2020 |
| KR | 10-2020-0029678 A | 3/2020 |
| KR | 10-2020-0071194 A | 6/2020 |

* cited by examiner

DISPLAY DEVICE WITH MULTILAYER DAMS

CROSS-REFERENCE TO RELATED APPLICATION

This application claims priority to and the benefit of Korean Patent Application No. 10-2020-0089155, filed on Jul. 17, 2020, in the Korean Intellectual Property Office, the disclosure of which is incorporated by reference herein in its entirety.

BACKGROUND

1. Field

One or more embodiments relate to a display device.

2. Description of Related Art

Display devices are used for various purposes. Furthermore, as display devices become thin and lightweight, the range of use of such display devices continues to expand. Research has been conducted to implement flexible display devices such as foldable display devices or rollable display devices, and the like, in addition to flat-type display devices.

The above information disclosed in this Background section is only for enhancement of understanding of the background and therefore the information discussed in this Background section does not necessarily constitute prior art.

SUMMARY

One or more embodiments include a display device having a structure that is capable of preventing or reducing the likelihood of resulting in a defect of the display device. However, the objective is just one example, and the scope of the disclosure is not limited thereto.

Additional aspects will be set forth in part in the description which follows and, in part, will be apparent from the description, or may be learned by practice of the presented embodiments of the disclosure.

According to one or more embodiments, a display device may include a substrate including a display area and a peripheral area surrounding the display area, a thin film transistor in the display area of the substrate, a first insulating layer on the substrate, the first insulating layer covering the thin film transistor, a signal line on the first insulating layer, the signal line being coupled to the thin film transistor, a second insulating layer on the first insulating layer, the second insulating layer covering the signal line, a power supply line in the peripheral area of the substrate, the power supply line configured to supply power to a pixel circuit including the thin film transistor, and a first dam including a multilayer structure on the power supply line, the first dam overlapping at least a part of the power supply line, in which the multilayer structure including a lowermost layer including the same material as the second insulating layer, and the lowermost layer is above the power supply line.

The first dam may be between the display area of the substrate and a terminal portion in the peripheral area.

The display device may further include an inorganic insulating layer between the substrate and the first insulating layer in the display area, the inorganic insulating layer extending toward and being in the peripheral area, in which the peripheral area includes a first sub-peripheral area adjacent to the display area, and a second sub-peripheral area outside the first sub-peripheral area, in which the first insulating layer and the second insulating layer of the display area may extend in to the first sub-peripheral area, and in which the power supply line may be between the first insulating layer and the second insulating layer in the first sub-peripheral area, and between the inorganic insulating layer and the first dam in the second sub-peripheral area.

The display device may further include a pixel electrode on the second insulating layer, the pixel electrode being coupled to the thin film transistor, a third insulating layer on the second insulating layer, the third insulating layer covering an edge of the pixel electrode, and a spacer on the third insulating layer, the spacer being around the pixel electrode.

The first dam may include a first layer in which the first layer is the lowermost layer, a second layer on the first layer, the second layer including the same material as the third insulating layer, and a third layer on the second layer, the third layer including the same material as the spacer.

Each of the first layer and the second layer of the first dam may have a step.

A thickness of the first layer of the first dam may be less than a thickness of the second insulating layer.

The display device may further include a second dam between the first dam and the display area, in which a height of the first dam is greater than a height of the second dam.

The second dam may include a first layer including the same material as the second insulating layer, and a second layer on the first layer, the second layer including the same material as the third insulating layer.

The second dam may include a first layer including the same material as the third insulating layer, and a second layer on the first layer, the second layer including the same material as the spacer.

The display device may further include a third dam between the second dam and the display area.

According to one or more embodiments, a display device may include a substrate including a display area and a peripheral area surrounding the display area, a thin film transistor in the display area of the substrate, a first insulating layer on the substrate, the first insulating layer covering the thin film transistor, a signal line on the first insulating layer, the signal line being coupled to the thin film transistor, a second insulating layer on the first insulating layer, the second insulating layer covering the signal line, a power supply line in the peripheral area of the substrate, the power supply line configured to supply power to a pixel circuit including the thin film transistor, and a first dam including a plurality of layers on the power supply line, the first dam overlapping at least a part of the power supply line, in which at least one of the plurality of layers includes a step, and the first dam has a step based on the at least one step of the plurality of layers.

The first dam may be in upper, lower, left, and right sides of the display area.

The display device may further include an inorganic insulating layer between the substrate and the first insulating layer in the display area, the inorganic insulating layer extending toward and being in the peripheral area, in which the peripheral area includes a first sub-peripheral area adjacent the display area, and a second sub-peripheral area outside the first sub-peripheral area, in which the first insulating layer and the second insulating layer of the display area extend in to the first sub-peripheral area, and in which the power supply line is between the first insulating layer and the second insulating layer in the first sub-peripheral area, and between the inorganic insulating layer and the first dam in the second sub-peripheral area.

The display device may further include a pixel electrode on the second insulating layer, the pixel electrode being coupled to the thin film transistor, a third insulating layer on the second insulating layer, the third insulating layer covering an edge of the pixel electrode, and a spacer on the third insulating layer, the spacer being around the pixel electrode.

The first dam may include a first layer including the same material as the second insulating layer, a second layer on the first layer, the second layer including the same material as the third insulating layer, and a third layer on the second layer, the third layer including the same material as the spacer.

A thickness of the first layer of the first dam may be less than a thickness of the second insulating layer.

The first dam may include a first layer including the same material as the first insulating layer, a second layer on the first layer, the second layer including the same material as the second insulating layer, a third layer on the second layer, the third layer including the same material as the third insulating layer, and a fourth layer on the third layer, the fourth layer including the same material as the spacer.

A thickness of the first layer of the first dam may be less than a thickness of the first insulating layer, and a thickness of the second layer of the first dam may be less than a thickness of the second insulating layer.

The display device may further include a second dam between the first dam and the display area, in which a height of the first dam is greater than a height of the second dam.

The display device may further include a third dam between the second dam and the display area, in which the height of the first dam is greater than a height of the third dam.

The peripheral area may include a first sub-peripheral area adjacent the display area, and a second sub-peripheral area outside the first sub-peripheral area, in which the first insulating layer and the second insulating layer of the display area extend in to the first sub-peripheral area, the first dam and the second dam may be on an inorganic insulating layer on the substrate in the second sub-peripheral area, and the third dam may be on the second insulating layer in the first sub-peripheral area.

BRIEF DESCRIPTION OF THE DRAWINGS

The above and other aspects, features, and characteristics of certain example embodiments of the disclosure will be more apparent from the following description taken in conjunction with the accompanying drawings, in which.

DETAILED DESCRIPTION

Figure 1:
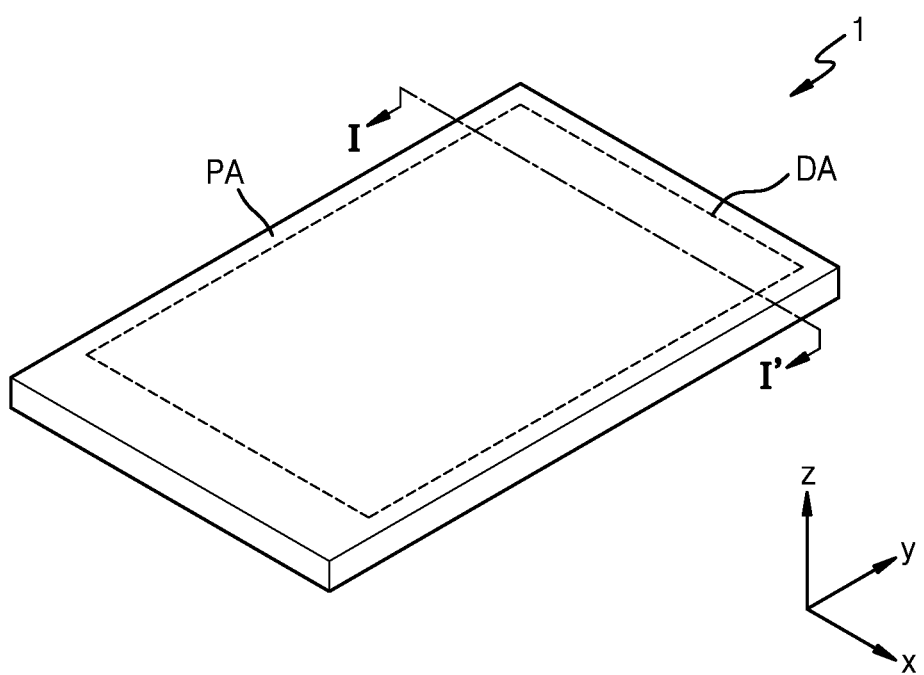
FIG. 1 is a schematic perspective view of a display device according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may, however, be embodied in many different forms and should not be construed as being limited to the embodiments set forth herein. Advantages and features of the disclosure and methods of accomplishing the same may be understood more readily by reference to the following detailed description of example embodiments and the accompanying drawings. Rather, these embodiments are provided so that this disclosure will be thorough and complete and will fully convey the concept of the disclosure to those skilled in the art, and the disclosure will only be defined by the appended claims and their equivalents.

While such terms as "first," "second," etc., may be used to describe various components, such components are not limited to the above terms. The above terms are used only to distinguish one component from another.

An expression used in the singular encompasses the expression of the plural, unless it has a clearly different meaning in context.

In the embodiments below, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, because sizes and thicknesses of components in the drawings are arbitrarily illustrated for convenience of explanation, the following embodiments are not limited thereto.

In the specification, the expression such as "A and/or B" may include A or B, or A and B. Furthermore, the expression such as "at least one of A and B" may include A or B, or A and B.

In an embodiment below, the meaning that the wiring "extends in the first direction or the second direction" includes not only extending in a linear direction, but also extending in a zigzag or a curve along the first direction or the second direction.

In the following embodiments, when an element is referred to as "on a plane," this means that an object part is viewed from above. When an element is referred to as "in a cross-section," it means that the cross-section of the object part is cut vertically and viewed from the side. In the following embodiments, when referred to as "overlapping," it includes overlapping "on a plane" and "in a cross-section."

Figure 2:
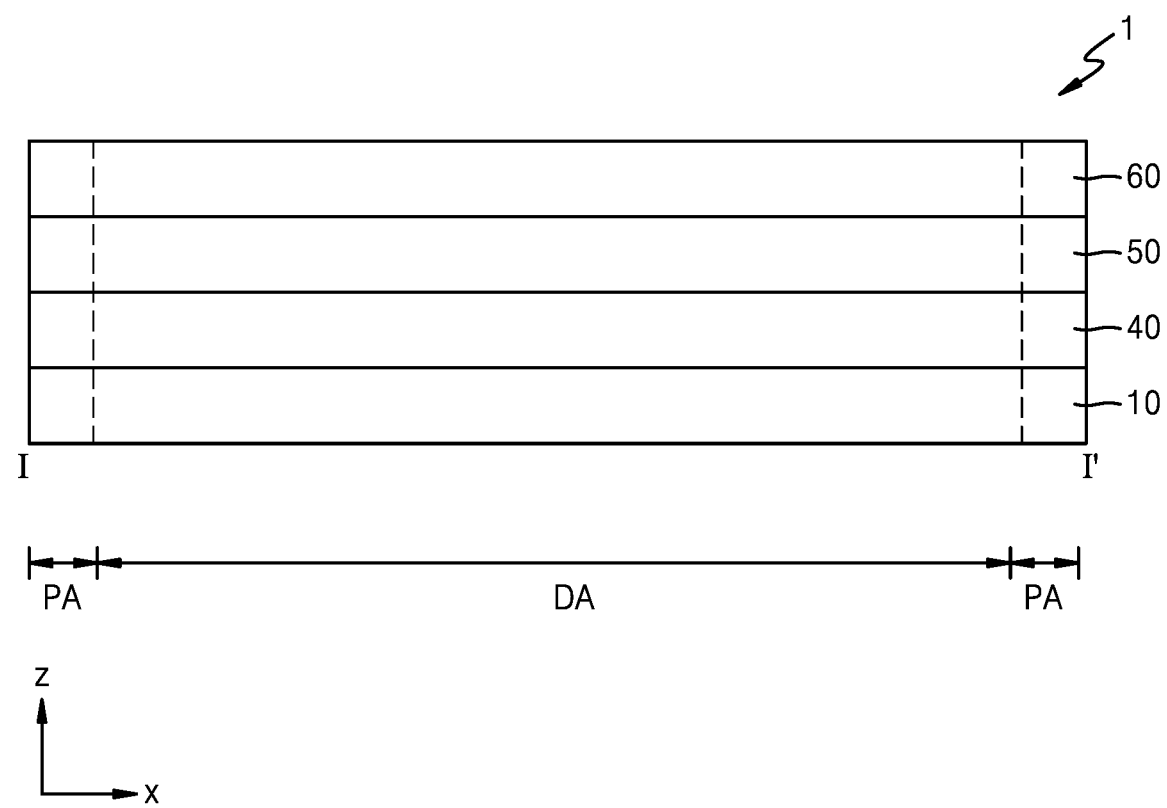
FIG. 2 is a cross-sectional view briefly illustrating a display device according to an embodiment.

FIG. 1 is a schematic perspective view of a display device 1 according to an embodiment. FIG. 2 is a cross-sectional view briefly illustrating the display device 1 of FIG. 1, which may correspond to a cross-section taken along the line I-I' of FIG. 1.

The display device 1 according to one or more embodiments may be implemented as electronic devices such as smartphones, mobile phones, smart watches, navigation devices, game consoles, TVs, head units for cars, notebook computers, laptop computers, tablet computers, personal media players (PMPs), personal digital assistants (PDAs), and the like. Furthermore, the electronic devices may be flexible devices (e.g., flexible display electronic devices).

The display device 1 may include a display area DA, where an image may be displayed, and a peripheral area PA provided around the display area DA. The display device 1 may display a certain image by using light emitted from a plurality of pixels arranged within the display area DA.

The display device 1 may come in various shapes including, for example, a rectangular shape having two pairs of sides parallel to each other. When the display device 1 is a rectangular shape, any one of the two pairs of sides may be longer than the other pair. In an embodiment, for convenience of explanation, the display device 1 has a rectangular shape with a pair of longer sides and a pair of shorter sides, and the direction of the pair of shorter sides is referred to herein as first direction (x direction), the direction of the pair of longer sides is referred to herein as second direction (y direction), and the direction perpendicular to the directions of the pair of longer sides and the pair of shorter sides is referred to herein as third direction (z direction). In another embodiment, the display device 1 may have a non-rectangular shape. The non-rectangular shape may be, for example, a circle, an oval, a polygon having a circular portion, or other polygons (except a rectangle).

When the display area DA has a flat shape (e.g., substantially flat shape), the display area DA may have a rectangular shape as shown in FIG. 1. In another embodiment, the display area DA may have a polygonal shape such as a triangle, a pentagon, a hexagon, and the like; or a circular shape, such as an oval shape, an amorphous shape, and the like.

The peripheral area PA is an area around the display area DA, which may be a a non-display area where there are no pixels. The display area DA may be entirely surrounded by the peripheral area PA. Various wirings for transmitting electrical signals to be applied to the display area DA, pads to which printed circuit boards or driver IC chips are attached, and the like may be arranged in the peripheral area PA.

In the following description, although an organic light-emitting display device is described as an example of the display device 1 according to an embodiment, the display device according to one or more embodiments is not limited thereto. In another embodiment, the display device 1 according to one or more embodiments may include, for example, inorganic light-emitting display devices or inorganic electroluminescent (EL) display devices, quantum-dot light-emitting display devices, or the like.

Referring to FIG. 2, the display device 1 may include a display panel 10, an input sensing layer 40 on the display panel 10, and an optical function layer 50, which may be covered with a window 60.

The display panel 10 may be configured to display an image. The display panel 10 may include pixels arranged in the display area DA. The pixels may include display elements. The display elements may be connected to a pixel circuit. The display elements may include an organic light-emitting diode (OLED), a quantum-dot OLED, and the like.

The input sensing layer 40 obtains coordinate information from an external input, for example, a touch event. The input sensing layer 40 may include a sensing electrode or a touch electrode, and trace lines connected to the sensing electrode. The input sensing layer 40 may be disposed on the display panel 10. The input sensing layer 40 may sense an external input by a mutual cap method or/and a self-cap method.

The input sensing layer 40 may be formed directly on the display panel 10 or it may be formed separately and then coupled to the display panel 10 using an adhesive layer such as an optical clear adhesive. For example, the input sensing layer 40 may be consecutively formed after a process of forming the display panel 10. That is, the display panel 10 may be formed, and then the input sensing layer 40 may be formed thereafter. In this case, the input sensing layer 40 may be formed as a part of the display panel 10, and the adhesive layer may not be between the input sensing layer 40 and the display panel 10. Although FIG. 2 illustrates that the input sensing layer 40 is between the display panel 10 and the optical function layer 50, in another embodiment, the input sensing layer 40 may be disposed on the optical function layer 50. That is, the optical function layer 50 may be on the display panel 10, and the input sensing layer 40 may be disposed on the optical function layer 50 thereof.

The optical function layer 50 may include an anti-reflection layer. The anti-reflection layer may reduce reflectance of light (e.g., external light) externally incident onto the display panel 10 through the window 60. The anti-reflection layer may include a retarder and a polarizer. The retarder may be a film type or a liquid crystal coating type and may include a $\lambda/2$ retarder and/or a $\lambda/4$ retarder. The polarizer may also be a film type or a liquid crystal coating type. The film type may include a stretchable synthetic resin film, and the liquid crystal coating type may include liquid crystals arranged in a certain arrangement. The retarder and the polarizer may further include a protection film. The retarder and the polarizer themselves, or the protection film, may be defined to be a base layer of the anti-reflection layer.

In another embodiment, the anti-reflection layer may include a black matrix and color filters. The color filters may be arranged with consideration to the colors of the light emitted from the respective pixels of the display panel 10. In another embodiment, the anti-reflection layer may include a destructive interference structure. The destructive interference structure may include a first reflection layer and a second reflection layer, which are arranged in different layers. First reflection light and second reflection light reflected respectively from the first reflection layer and the second reflection layer, may destructively interfere with each other, thus reducing the reflectance of external light.

The optical function layer 50 may include a lens layer. The lens layer may improve a light output efficiency of the light emitted from the display panel 10 or decrease color deviation of the light. The lens layer may include a layer having a concave or convex lens shape, or/and a plurality of layers having different refractive indexes. In some embodiments, the optical function layer 50 may include all of the above-described anti-reflection layer and lens layer, or any one thereof.

In an embodiment, the optical function layer 50 may be consecutively formed after a process of forming the display panel 10 and/or the input sensing layer 40. That is, the display panel 10 may be formed, and then the optical function layer 50 may be formed thereafter; or the input sensing layer 40 may be formed, and then the optical function layer 50 may be formed thereafter. In this case, an adhesive layer may not be between the optical function layer 50 and the display panel 10 and/or the input sensing layer 40.

Figure 3:
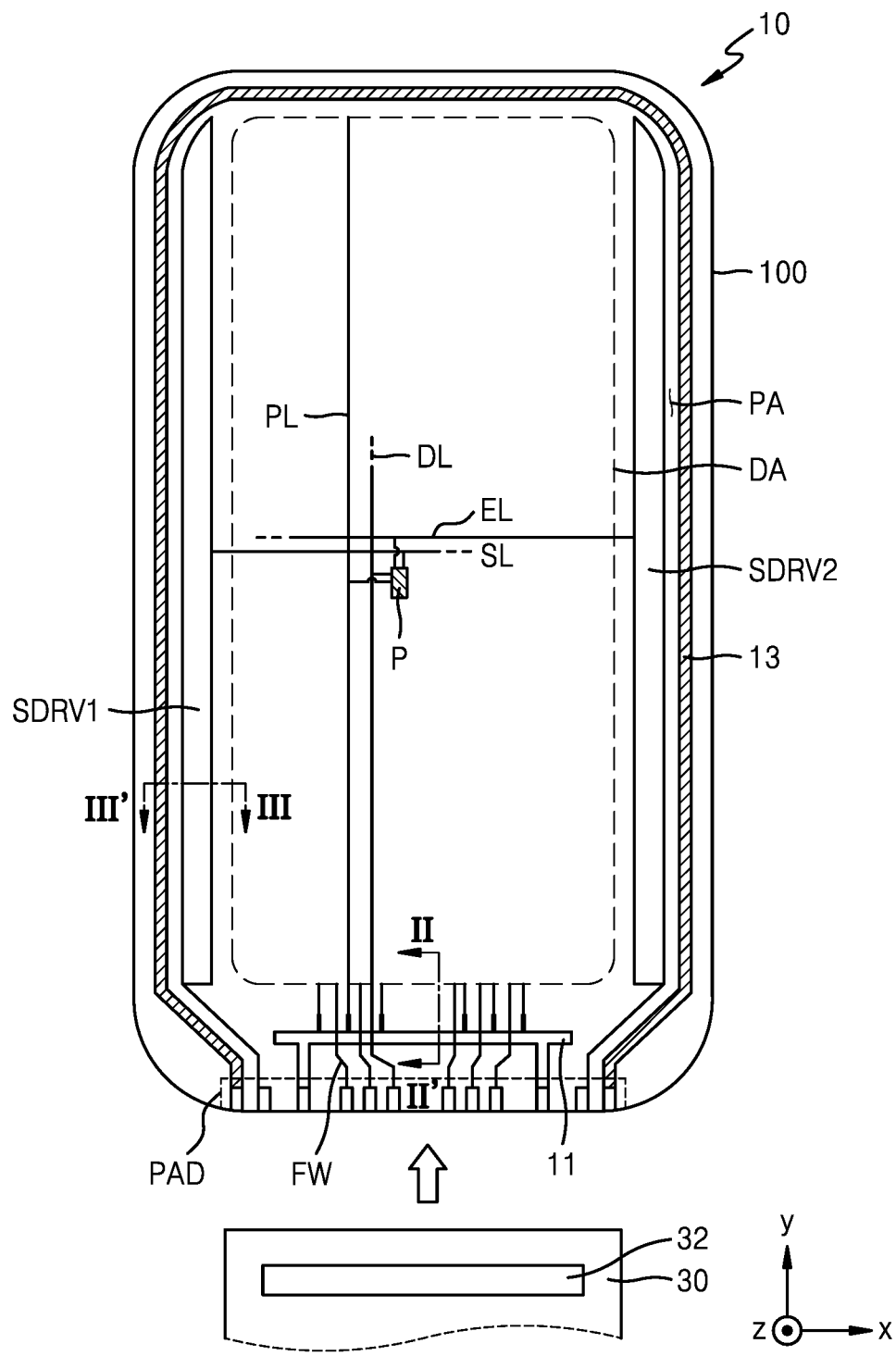
FIG. 3 is a schematic plan view of a display panel according to an embodiment.

FIG. 3 is a schematic plan view of the display panel 10 according to an embodiment.

Referring to FIG. 3, various constituent elements that form the display panel 10 are arranged on a substrate 100. The substrate 100 may include the display area DA and the peripheral area PA surrounding the display area DA.

A plurality of pixels P and signal lines for applying electrical signals to the pixels P may be arranged in the display area DA. The pixels P each may be implemented by a display element such as an OLED. Each pixel P may emit, for example, a red, a green, a blue, or a white light. The display area DA may be covered with a sealing member and protected from external air or moisture, and the like.

Signal lines for applying electrical signals to the pixels P may include a plurality of scan lines SL and a plurality of data lines DL. Each of the scan lines SL may extend in the first direction (x direction), and each of the data lines DL may extend in the second direction (y direction). The scan lines SL may be arranged, for example, in a plurality of rows, to transmit scan signals to the pixels P, and the data lines DL may be arranged, for example, in a plurality of columns, to transmit data signals to the pixels P. Each of the pixels P may be coupled (e.g., connected) to at least one corresponding scan line SL of the scan lines SL and a corresponding data line DL of the data lines DL.

The signal lines may further include a plurality of driving voltage lines PL, a plurality of emission control lines EL, and the like. Each of the emission control lines EL may extend in the x direction, and each of the driving voltage lines PL may extend in the y direction. The emission control lines EL may be arranged, for example, in a plurality of rows, and may transmit emission control signals to the pixels P. The driving voltage lines PL may be arranged, for example, in a plurality of columns, and may transmit driving voltage signals (driving voltage) to the pixels P.

Each of the pixel circuits for driving the pixels P may be electrically connected to external circuits arranged in the peripheral area PA. There are no pixels P in the peripheral area PA but instead, various electronic devices, printed circuit boards, and the like may be electrically attached, and a voltage line for supplying power to drive the pixels P, and the like may be located there. For example, a first scan driving circuit SDRV1, a second scan driving circuit SDRV2, a terminal portion PAD, and a power supply line may be arranged in the peripheral area PA. The power supply line may include a driving voltage supply line 11 and a common voltage supply line 13.

The first scan driving circuit SDRV1 may apply a scan signal to each of the pixel circuits for driving the pixels P through the scan lines SL. The second scan driving circuit SDRV2 may apply an emission control signal to each pixel circuit through the emission control lines EL. The second scan driving circuit SDRV2 may be located at opposite sides of the display area DA from the first scan driving circuit SDRV1, and approximately parallel to the first scan driving circuit SDRV1.

The terminal portion PAD may be disposed at one side of the substrate 100. The terminal portion PAD is exposed and not covered by an insulating layer and connected to a display circuit board 30. A display driving portion 32 may be disposed on the display circuit board 30.

The display driving portion 32 may generate a control signal to be transmitted to the first scan driving circuit SDRV1 and the second scan driving circuit SDRV2. The display driving portion 32 may generate a data signal, and the generated data signal may be transmitted to the pixel circuits of pixels P through fan-out lines FW and the data lines DL connected to the fan-out lines FW. The fan-out lines FW may extend in the y direction.

The display driving portion 32 may supply a driving voltage ELVDD to the driving voltage supply line 11, and a common voltage ELVSS to the common voltage supply line 13. The driving voltage ELVDD may be applied to the pixel circuits of pixels P through the driving voltage lines PL connected to the driving voltage supply line 11. The common voltage ELVSS may be applied to a counter electrode of the display elements through the common voltage supply line 13.

The driving voltage supply line 11 may be connected to the terminal portion PAD and provided by extending in the x direction at a lower side (as oriented in FIG. 3) of the display area DA. The common voltage supply line 13 may be connected to the terminal portion PAD, may have a loop shape with one open side, for example, the lower side of the display area DA, and may partially surround the display area DA. The common voltage supply line 13 may extend in the y direction at the left and right sides (as oriented in FIG. 3) of the display area DA, and in the x direction at the upper side (as oriented in FIG. 3) of the display area DA.

Figure 4:
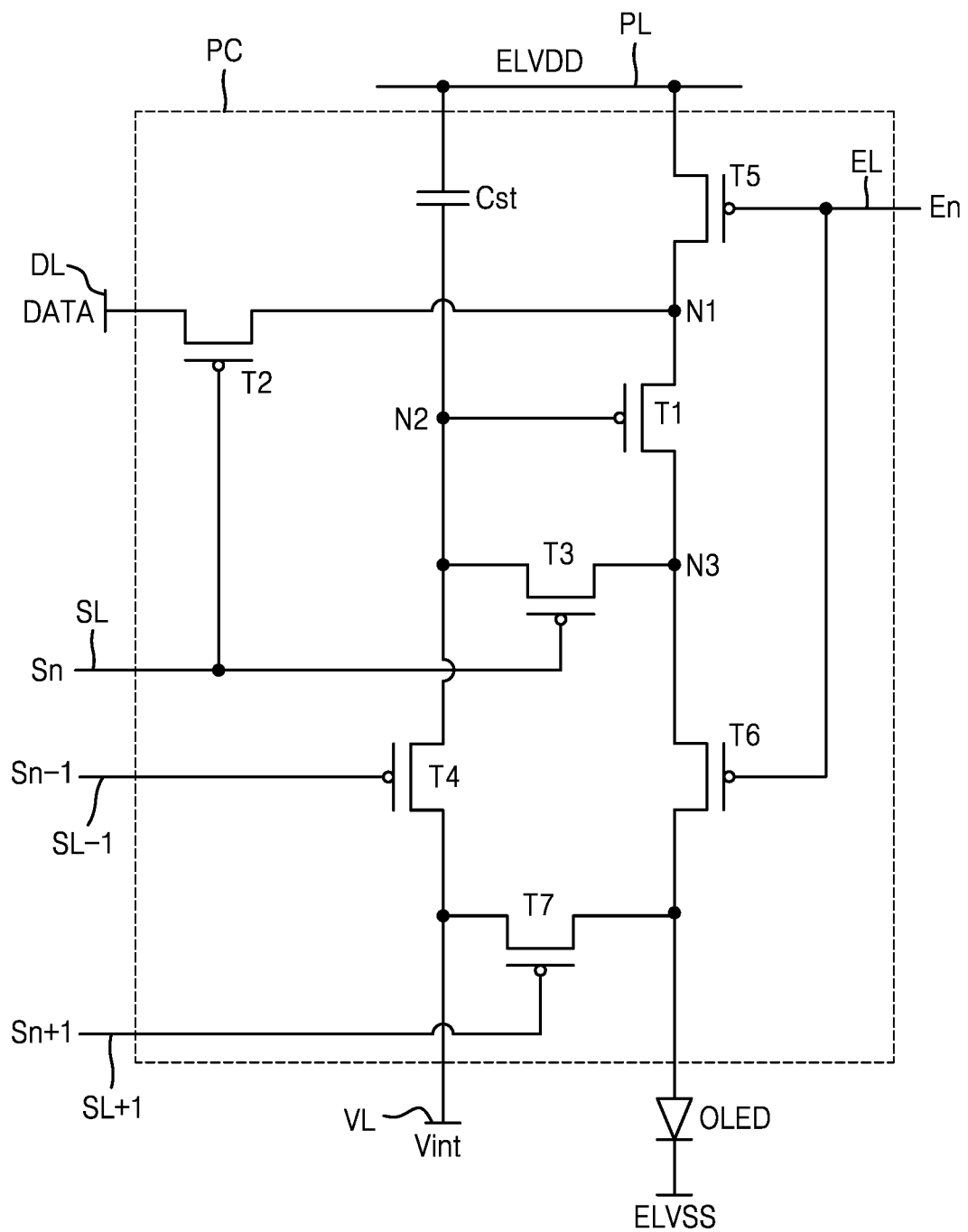
FIG. 4 is an equivalent circuit diagram of a pixel according to an embodiment.

FIG. 4 is an equivalent circuit diagram of a pixel according to an embodiment.

Referring to FIG. 4, a pixel circuit PC may include first to seventh transistors T1 to T7, and depending on the types (p-type or n-type) and/or the operational conditions of the transistors, a first terminal of each of the first to seventh transistors T1 to T7 may be a source terminal or a drain terminal, and a second terminal thereof may be a terminal different from the first terminal. For example, when the first terminal is a source terminal, the second terminal may be a drain terminal, and vice versa.

The pixel circuit PC may be connected to a first scan line SL for transmitting a first scan signal Sn, a second scan line SL−1 for transmitting a second scan signal Sn−1, a third scan line SL+1 for transmitting a third scan signal Sn+1, an emission control line EL for transmitting an emission control signal En, the data line DL for transmitting a data signal DATA, the driving voltage lines PL for the driving voltage ELVDD, and an initialization voltage line VL for transmitting an initialization voltage Vint.

The first transistor T1 may include a gate terminal connected to a second node N2, the first terminal connected to a first node N1, and the second terminal connected to a third node N3. The first transistor T1, which functions as a driving transistor, receives the data signal DATA and supplies a driving current to an emission device, according to a switching operation of the second transistor T2. The emission device may include an OLED.

The second transistor T2 (switching transistor) may include a gate terminal connected to the first scan line SL, the first terminal connected to the data line DL, and the second terminal connected to the first node N1 (or the first terminal of the first transistor T1). The second transistor T2 may be turned on according to the first scan signal Sn received through the first scan line SL to perform a switching operation to transmit the data signal DATA transmitted through the data line DL, to the first node N1.

The third transistor T3 (a compensation transistor) may include a gate terminal connected to the first scan line SL, a first terminal connected to the second node N2 (or the gate terminal of the first transistor T1), and a second terminal connected to the third node N3 (or the second terminal of the first transistor T1). The third transistor T3 may be turned on according to the first scan signal Sn received through the first scan line SL to be diode-connected to the first transistor T1. The third transistor T3 may have a structure where two or more transistors are serially connected.

The fourth transistor T4 (first initialization transistor) may include a gate terminal connected to the second scan line SL−1, a first terminal connected to the initialization voltage line VL, and a second terminal connected to the second node N2. The fourth transistor T4 may be turned on according to the second scan signal Sn−1 received through the second scan line SL−1 to initialize a gate voltage of the first transistor T1 by transmitting the initialization voltage Vint to the gate terminal of the first transistor T1. The fourth transistor T4 may have a structure where two or more transistors are serially connected.

The fifth transistor T5 (first emission control transistor) may include a gate terminal connected to the emission control line EL, a first terminal connected to the driving voltage lines PL, and a second terminal connected to the first node N1. The sixth transistor T6 (second emission control transistor) may include a gate terminal connected to the emission control line EL, a first terminal connected to the third node N3, and a second terminal connected to a pixel electrode of the OLED. The fifth transistor T5 and the sixth transistor T6 are simultaneously turned on according to the emission control signal En received through the emission control line EL so that a current flows in the OLED.

The seventh transistor T7 (second initialization transistor) may include a gate terminal connected to the third scan line SL+1, a first terminal connected to the second terminal of the sixth transistor T6 and the pixel electrode of the OLED, and the second terminal connected to the initialization voltage line VL. The seventh transistor T7 may be turned on according to the third scan signal Sn+1 received through the third scan line SL+1 to transmit the initialization voltage Vint to the pixel electrode of the OLED so that the voltage of the pixel electrode of the OLED may be initialized. In some embodiments, the seventh transistor T7 may be omitted.

A capacitor Cst may include a first electrode connected to the second node N2 and a second electrode connected to the driving voltage lines PL.

The OLED may include the pixel electrode and a counter electrode facing the pixel electrode, and the common voltage ELVSS may be applied to the counter electrode. The OLED receives a driving current from the first transistor T1 to emit light of a certain color, thereby displaying an image (e.g., a portion of an image). The counter electrode may be provided commonly to, that is, integrally with, a plurality of pixels. In other words, the counter electrode may be coupled (e.g., commonly coupled) with the counter electrodes of the other pixels in the display area DA.

Although FIG. 4 illustrates a case in which the fourth transistor T4 and the seventh transistor T7 are connected to the second scan line SL−1 and the third scan line SL+1, respectively, the disclosure is not limited thereto. In another embodiment, the fourth transistor T4 and the seventh transistor T7 may be both connected to the second scan line SL−1 to be driven according to the second scan signal Sn−1.

Figure 5:
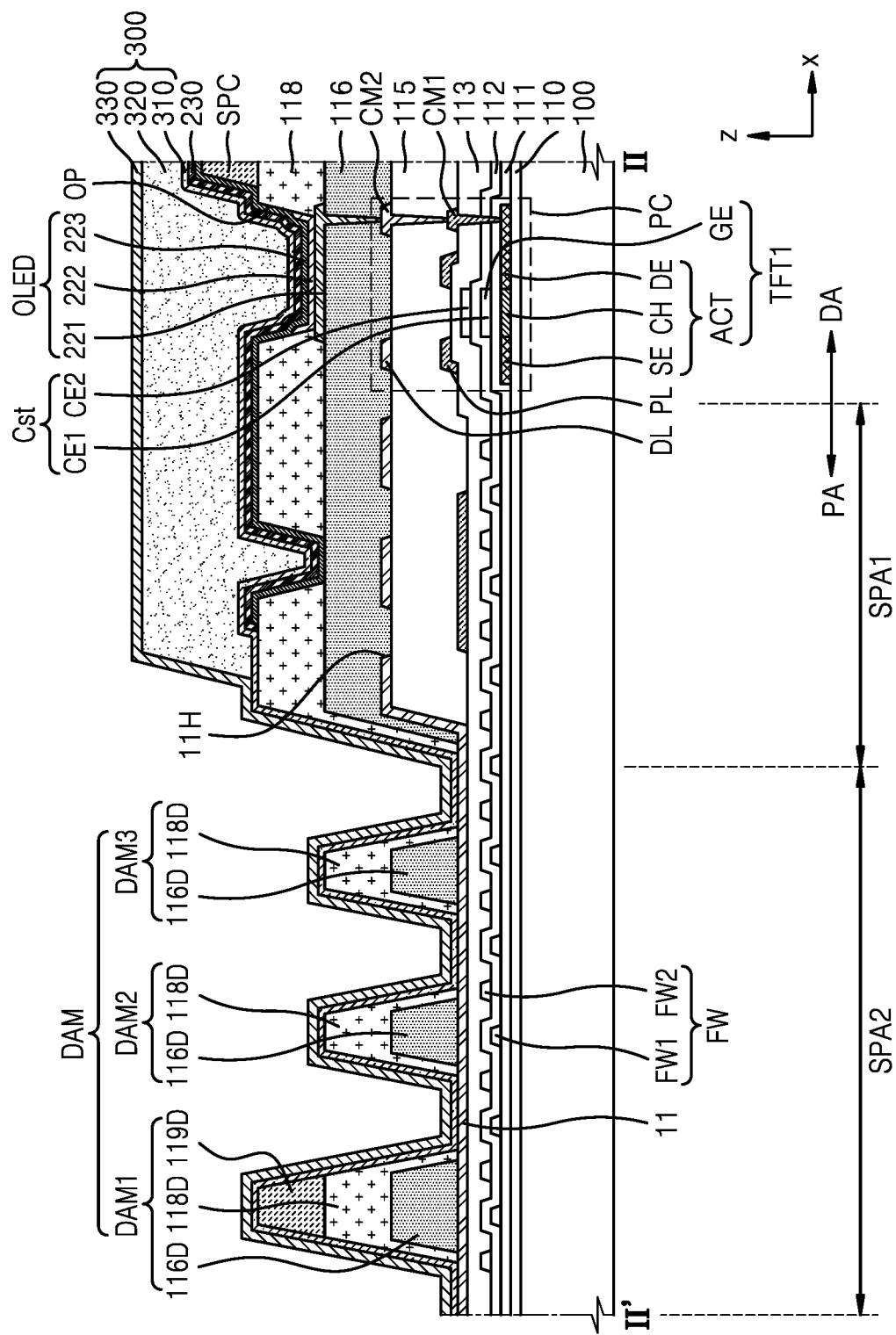
FIG. 5 is a cross-sectional view of a portion of a display panel taken along the line II-II' FIG. 3.
Figure 6:
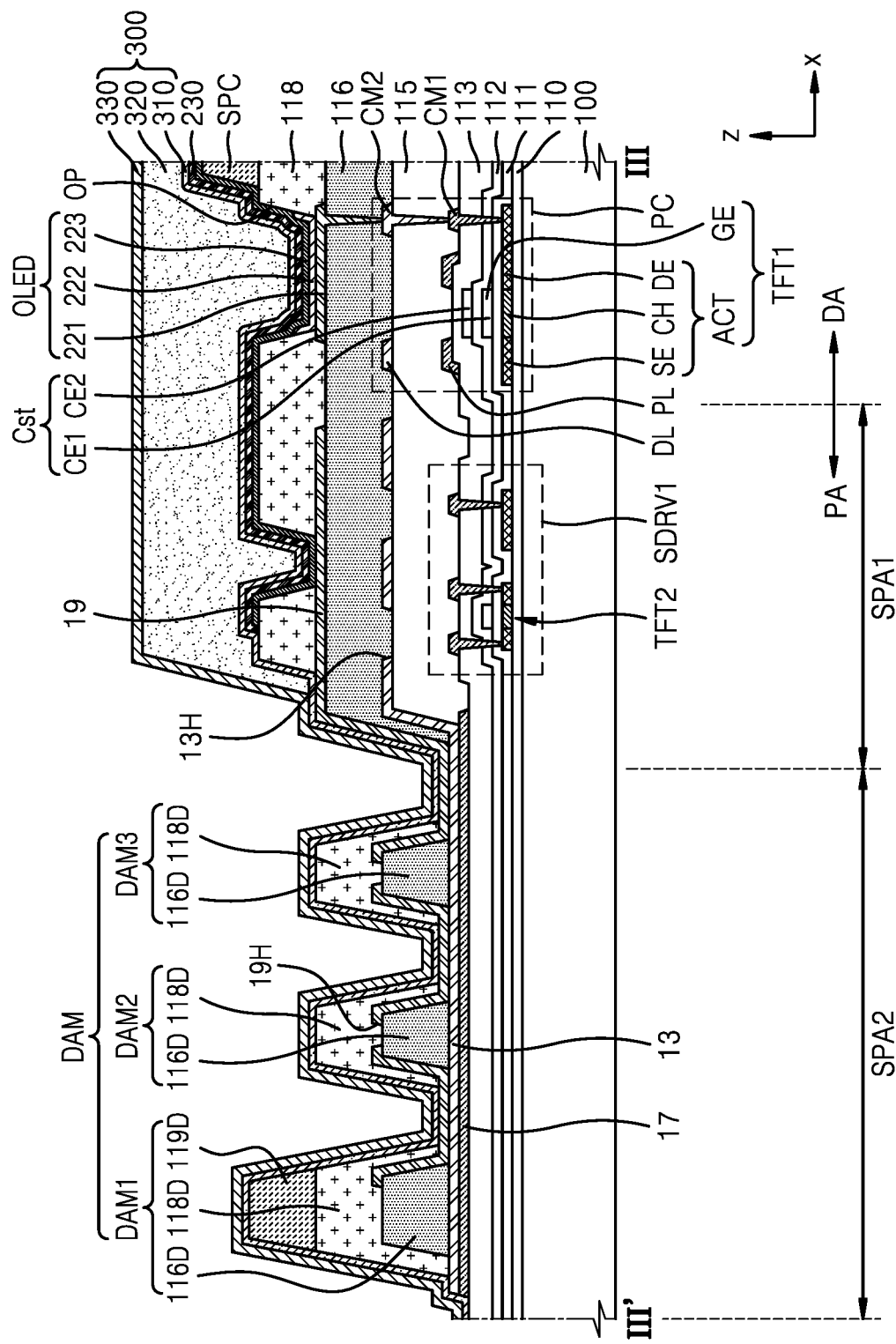
FIG. 6 is a cross-sectional view of a portion of a display panel taken along the line III-III' of FIG. 3.
Figure 7:
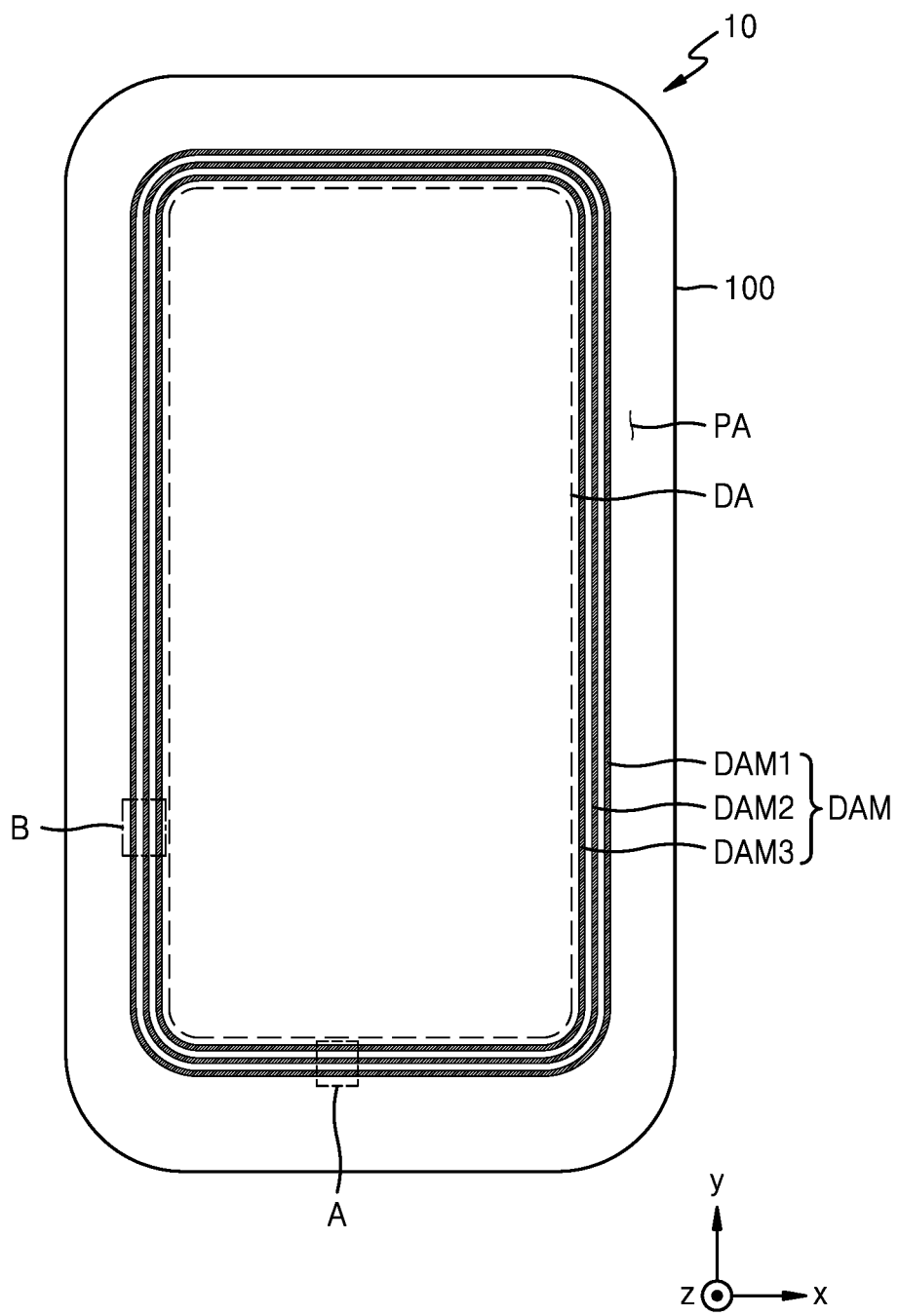
FIG. 7 is a schematic view of a portion of a display panel, describing an arrangement of dams according to an embodiment.
Figure 8A:
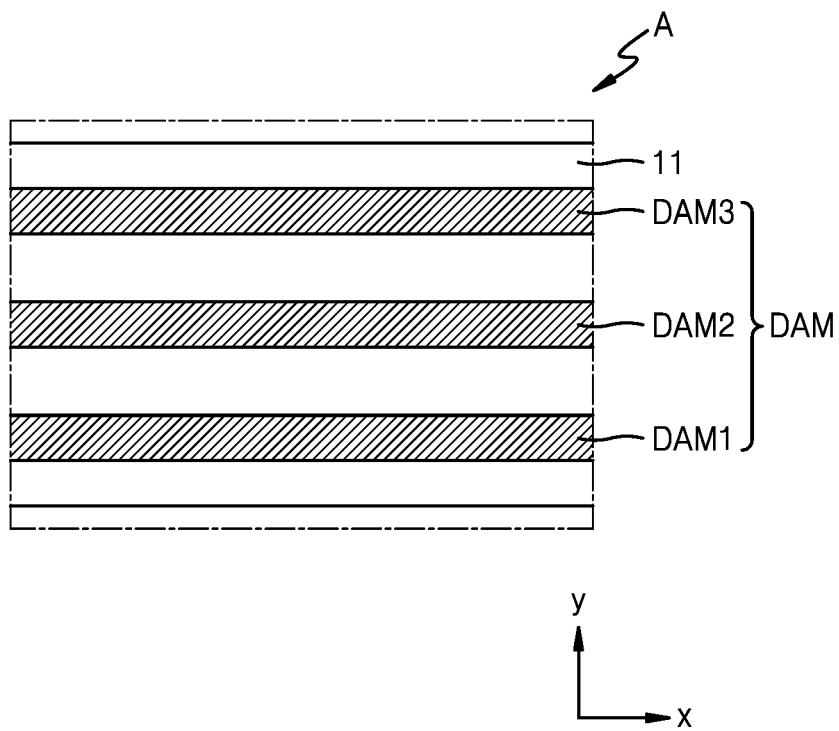
FIG. 8A is an enlarged schematic plan view of portion A of FIG. 7.
Figure 8B:
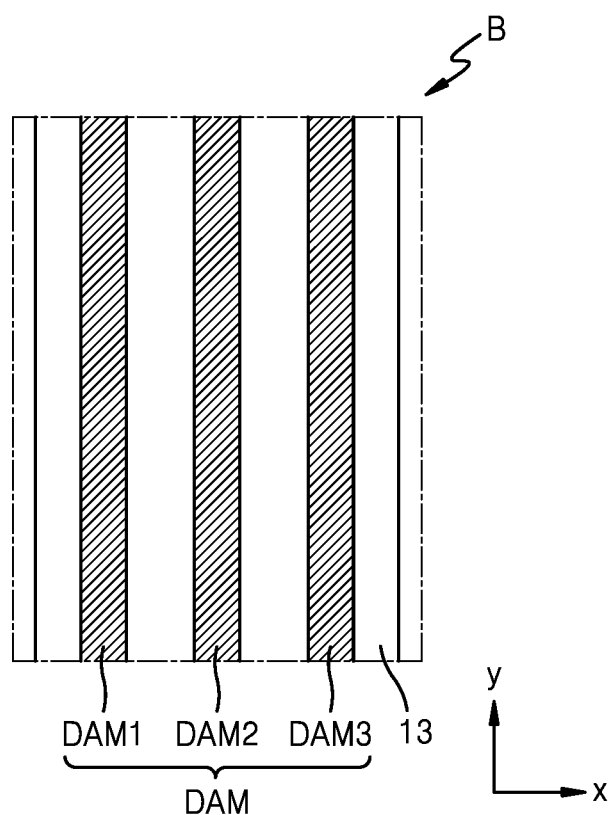
FIG. 8B is an enlarged schematic plan view of portion B of FIG. 7.
Figure 9:
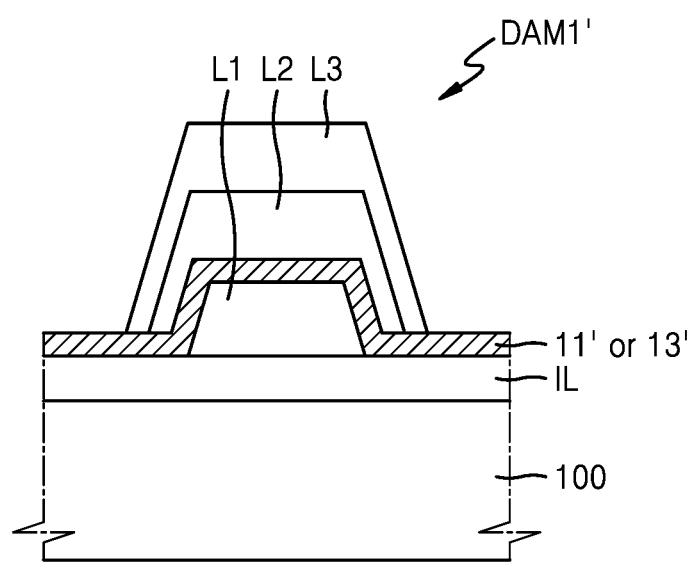
FIG. 9 illustrates an example of a first dam DAM1' according to a comparative example.
Figure 10:
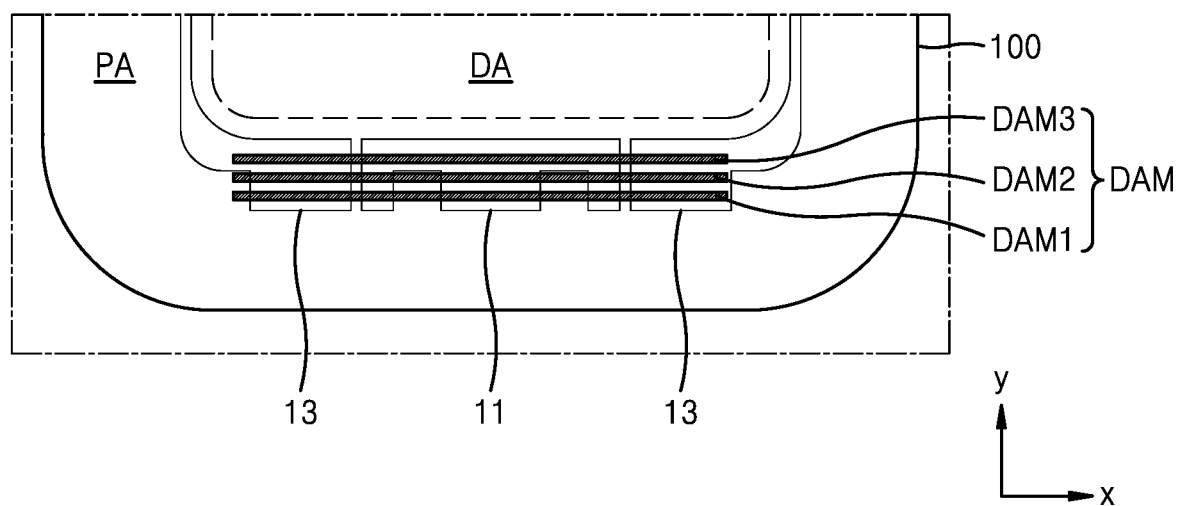
FIG. 10 is a schematic view of a portion of a display panel, describing an arrangement of dams according to an embodiment.

FIG. 5 is a cross-sectional view of a portion of the display panel 10 taken along the line II-II' FIG. 3. FIG. 6 is a cross-sectional view of a portion of the display panel 10 taken along the line III-III' of FIG. 3. FIG. 7 is a schematic view of a portion of the display panel 10, describing an arrangement of dams according to an embodiment. FIG. 8A is a schematic enlarged plan view of a portion A of FIG. 7. FIG. 8B is a schematic enlarged plan view of a portion B of FIG. 7. FIG. 9 illustrates an example of a first dam DAM1' according to a comparative example. FIG. 10 is a schematic view of a portion of the display panel 10, describing an arrangement of the dams according to an embodiment.

FIGS. 5 and 6 may be cross-sectional views of the display panel 10, to which the pixel of FIG. 4 is applied.

First, referring to the display area DA of FIGS. 5 and 6, the pixel circuit PC and the OLED electrically connected to the pixel circuit PC may be arranged in the display area DA of the substrate 100. The pixel circuit PC may include a first thin film transistor TFT1 and the capacitor Cst.

The substrate 100 may include various materials such as a metallic material, a plastic material, and the like. According to an embodiment, the substrate 100 may be a flexible substrate, and the substrate 100 may include a first base layer, a first barrier layer, a second base layer, and a second barrier layer, which are sequentially stacked (e.g., one layer over another layer in sequence). The first base layer and the second base layer each may include polymer resin. For example, the first base layer and the second base layer each may include polymer resin such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), cellulose acetate propionate (CAP), and the like. The polymer resin may be transparent. The first barrier layer and the second barrier layer may each be a layer for reducing (e.g., preventing) intrusion of foreign materials, and may be a single layer or a multilayer including inorganic material such as amorphous silicon, silicon nitride, and/or silicon oxide.

A buffer layer 110 may be disposed on the substrate 100. The buffer layer 110 may reduce (e.g., block) foreign materials or moisture intruding through the substrate 100. The buffer layer 110 may include inorganic materials such as a silicon oxide, a silicon nitride, and/or a silicon oxynitride, and the like, and may be formed in a single layer or a multilayer.

The first thin film transistor TFT1 may be one of the transistors described with reference to FIG. 4, for example, the first transistor T1, which is a driving transistor. The first thin film transistor TFT1 may include a semiconductor layer ACT, a gate electrode GE, a source electrode SE, and a drain electrode DE.

The semiconductor layer ACT may include amorphous silicon, polycrystalline silicon, an oxide semiconductor material, or an organic semiconductor material. The semiconductor layer ACT may include a channel region CH overlapping the gate electrode GE, and a source region SE and a drain region DE arranged at both sides of the channel region CH, and may also include impurities. The impurities may include N-type impurities or P-type impurities. The source region SE and the drain region DE may respectively be a source electrode and a drain electrode of the first thin film transistor TFT1.

The gate electrode GE may include, for example, one or more materials such as, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), considering adhesion to of the material to an adjacent layer, surface flatness and processability of a stacked layer, and the like, and may be formed as a single layer or a multilayer. A first gate insulating layer 111 may be disposed between the semiconductor layer ACT and the gate electrode GE.

The capacitor Cst may include a lower electrode CE1 and an upper electrode CE2 overlapping each other with a second gate insulating layer 112 therebetween. The capacitor Cst may overlap the first thin film transistor TFT1. FIGS. 5 and 6 illustrate that the gate electrode GE of the first thin film transistor TFT1 is the lower electrode CE1 of the capacitor Cst. In another embodiment, the capacitor Cst may not overlap the first thin film transistor TFT1.

The first gate insulating layer 111 and the second gate insulating layer 112 may include an inorganic insulating material such as a silicon oxide, a silicon nitride, a silicon oxynitride, an aluminum oxide, a titanium oxide, a tantalum oxide, a hafnium oxide, and the like. The first gate insulating layer 111 and the second gate insulating layer 112 may be a single layer or a multilayer including the above-described material.

The capacitor Cst may be covered with an interlayer insulating layer 113. The interlayer insulating layer 113 may include an inorganic insulating material such as a silicon oxide, a silicon nitride, a silicon oxynitride, an aluminum oxide, a titanium oxide, a tantalum oxide, a hafnium oxide, and the like. The interlayer insulating layer 113 may be a single layer or a multilayer including the above-described material.

The driving voltage lines PL and a first connection electrode CM1 may be arranged on the interlayer insulating layer 113. The driving voltage lines PL and the first connection electrode CM1 each may include one or more materials such as, Al, Pt, Pd, Ag, Mg, Au, Ni, Nd, Ir, Cr, Li, Ca, Mo, Ti, W, and Cu, in a single layer or a multilayer. In an embodiment, each of the driving voltage lines PL and the first connection electrode CM1 may be formed as a multilayer of Ti/Al/Ti.

A first insulating layer 115 may be disposed on the driving voltage lines PL and the first connection electrode CM1. The data line DL and a second connection electrode CM2 may be arranged on the first insulating layer 115. The data line DL and the second connection electrode CM2 each may include the same material as the driving voltage lines PL. For example, the data line DL and the second connection electrode CM2 may each include one or more materials such as, Al, Pt, Pd, Ag, Mg, Au, Ni, Nd, Ir, Cr, Li, Ca, Mo, Ti, W, and Cu, in a single layer or a multilayer. In an embodiment, the data line DL and the second connection electrode CM2 each may be formed as a multilayer of Ti/Al/Ti. The data line DL and the second connection electrode CM2 may be covered with a second insulating layer 116. The data line DL may at least partially overlap the driving voltage lines PL as illustrated in FIGS. 5 and 6. In another embodiment, the data line DL may not overlap the driving voltage lines PL.

In the embodiment of FIGS. 5 and 6, although the data line DL is disposed on an upper surface of each of the driving voltage lines PL. In another embodiment, the data line DL may be disposed on the interlayer insulating layer 113 or the driving voltage lines PL may be disposed on the first insulating layer 115, and thus, the data line DL and the driving voltage lines PL may be disposed in the same layer. In another embodiment, each of the driving voltage lines PL may have a dual layer structure including a lower driving voltage line disposed on the interlayer insulating layer 113 and an upper driving voltage line disposed on the first insulating layer 115 and electrically connected to the lower driving voltage line.

The first insulating layer 115 and the second insulating layer 116, formed as planarization insulating layers, may be organic insulating layers. For example, the first insulating layer 115 and the second insulating layer 116 may each include an organic insulating material, for example, general purpose polymers such as polymethylmethacrylate (PMMA) or polystyrene (PS), polymer derivatives having a phenol-based group, acryl-based polymers, imide-based polymers, siloxane-based polymers, aryl ether-based polymers, amide-based polymers, fluorine-based polymers, p-xylene based polymers, vinyl alcohol-based polymers, and blends thereof, and the like. In an embodiment, the first insulating layer 115 and/or the second insulating layer 116 may be an organic insulating layer including PI or an organic insulating layer including siloxane.

A display element, for example, OLED, may be disposed in the display area DA above the second insulating layer 116. The OLED may include a first electrode 221 that is a pixel electrode, an intermediate layer 222, and a second electrode 223 that is a counter electrode.

The first electrode 221 of the OLED is disposed on the second insulating layer 116 and may be connected to the first thin film transistor TFT1 via the first connection electrode CM1 on the interlayer insulating layer 113, and the second connection electrode CM2 on the first insulating layer 115.

The first electrode 221 may include a conductive oxide such as an indium tin oxide (ITO), an indium zinc oxide (IZO), a zinc oxide (ZnO), an indium oxide ($In_2O_3$), an indium gallium oxide (IGO), or an aluminum zinc oxide (AZO). In another embodiment, the first electrode 221 may include a reflective film including Ag, Mg, Al, Pt, Pd, Au, Ni, Nd, Ir, Cr, or a compound thereof. In another embodiment, the first electrode 221 may further include a film including ITO, IZO, ZnO, or $In_2O_3$, above and/or below the above-described reflection film.

A third insulating layer 118 may be disposed on the second insulating layer 116. The third insulating layer 118 may include an opening for each pixel in the display area DA, that is, an opening OP for exposing a part of the first electrode 221. In the third insulating layer 118, as a pixel defining layer, the opening OP may define an emission area of a pixel. The emission area may be where an emission layer is disposed such that the emission layer emits light. In other words, the third insulating layer 118 may be disposed to correspond to an area other than the emission area, that is, a non-emission area. In some embodiments, the size of the emission area may vary according to the color of light that a pixel emits.

Furthermore, because the third insulating layer 118 increases a distance between an edge portion of the first electrode 221 and a portion of the second electrode 223 that is above the first electrode 221, arcs or the like may be reduced (e.g., prevented) from being generated at the edge of the first electrode 221. The third insulating layer 118 may include, for example, an organic material such as PI, hexamethyldisiloxane (HMDSO), and the like.

The intermediate layer 222 may include the emission layer. The emission layer may include a polymer or a low-molecular organic material that emits light of a certain color. In an embodiment, the intermediate layer 222 may include a first functional layer disposed below the emission layer and/or a second functional layer disposed above the emission layer. The first functional layer and/or the second functional layer may include a layer that is integral across the first electrodes 221, or a layer patterned to correspond to each of the first electrodes 221.

The first functional layer may be a single layer or a multilayer. For example, when the first functional layer includes a polymer material, the first functional layer may have a single layer structure, that is, a hole transport layer (HTL). and the polymer material may include, for example, poly-(3,4)-ethylene-dihydroxy thiophene (PEDOT) or polyaniline (PANI). When the first functional layer includes a low-molecular weight material, the first functional layer may include a hole injection layer (HIL) and a hole transport layer (HTL).

In some embodiments, the second functional layer may be omitted. However, for example, when the first functional layer and the emission layer each include a polymer material, to improve the characteristics of the OLED, the second functional layer may be desirable or necessary. The second functional layer may be a single layer or a multilayer. The second functional layer may include an electron transport layer (ETL) and/or an electron injection layer (EIL).

The second electrode 223 may be disposed to face the first electrode 221 with the intermediate layer 222 therebetween. The second electrode 223 may include a conductive material having a low work function. For example, the second electrode 223 may include a transparent or semi-transparent layer including Ag, Mg, Al, Pt, Pd, Au, Ni, Nd, Ir, Cr, Li, Ca, an alloy thereof, and the like. Alternatively, the second electrode 223 may further include a layer such as ITO, IZO, ZnO, or $In_2O_3$ on the transparent or semi-transparent layer including the above-described material.

The second electrode 223 may be integrally formed for a plurality of OLEDs in the display area DA to face the first electrodes 221 and may be disposed above the intermediate layer 222 and the third insulating layer 118.

A plurality of spacers SPC may be further disposed in the non-emission areas of the display area DA. The spacers SPC may be disposed around the first electrodes 221, that is, between the first electrodes 221. The spacer SPC may be disposed above the third insulating layer 118. The spacer SPC may be an island-shaped insulating pattern. The spacer SPC may have a polygonal shape such as a rectangle, a circle, a triangle, an oval, and the like. The spacer SPC may include an organic insulating material such as polyimide. Alternatively, the spacer SPC may include an inorganic insulating material such as a silicon nitride or a silicon oxide, or an organic insulating material and an inorganic insulating material. The spacer SPC may include a material different from the third insulating layer 118. Alternatively, the spacer SPC may include the same material as one of the first insulating layer 115, the second insulating layer 116, and the third insulating layer 118. The spacer SPC may maintain a gap between the substrate 100 and an encapsulation layer 300 and support the encapsulation member 300. The second electrode 223 may be disposed above the spacer SPC.

The encapsulation layer 300 may be disposed on the second electrode 223 so that the display panel 10 may be protected from external foreign material, moisture, and the like. The encapsulation layer 300 may include at least one organic encapsulation layer and at least one inorganic encapsulation layer. FIGS. 5 and 6 illustrate that the encapsulation layer 300 includes first and second inorganic encapsulation layers 310 and 330 and an organic encapsulation layer 320 therebetween. In another embodiment, the number of organic encapsulation layers, the number of inorganic encapsulation layers, and a stacking order may be changed.

As desired or necessary, a plurality of layers including a capping layer 230 may be disposed between the first inorganic encapsulation layer 310 and the second electrode 223. Although FIGS. 5 and 6 illustrate that the capping layer 230 is provided, in another embodiment, the capping layer 230 may be omitted.

The first and second inorganic encapsulation layers 310 and 330 may include one or more inorganic insulating materials such as an aluminum oxide, a titanium oxide, tantalum oxide, a hafnium oxide, a zinc oxide, a silicon oxide, a silicon nitride, a silicon oxynitride, and the like. The organic encapsulation layer 320 may include polyethylene terephthalate, polyethylene naphthalate, polycarbonate, polyimide, polyethylene sulfonate, polyoxymethylene, polyarylate, hexamethyldisiloxane, acryl-based resin, for example, polymethylmethacrylate, polyacryl acid, and the like, or any combination thereof. As the first inorganic encapsulation layer 310 is formed according to a structure thereunder, an upper surface of the first inorganic encapsulation layer 310 may not be flat. In some embodiments, the organic encapsulation layer 320 may cover the first inorganic encapsulation layer 310 and have a sufficient thickness. In this case, the upper surface of the organic encapsulation layer 320 may be substantially flat. The second inorganic encapsulation layer 330 may extend outside the organic encapsulation layer 320 to be in contact with the first inorganic encapsulation layer 310 so that the organic encapsulation layer 320 is not be exposed to the outside.

Next, the peripheral area PA is described. The peripheral area PA of FIG. 5 may correspond to the lower side portion of the display area DA of FIG. 3, and the peripheral area PA of FIG. 6 may correspond to the left or right side portion of the display area DA of FIG. 3. The peripheral area PA may include a first sub-peripheral area SPA1 relatively adjacent to the display area DA and a second sub-peripheral area SPA2 relatively adjacent to an edge of the substrate 100 outside the first sub-peripheral area SPA1. The first insulating layer 115, the second insulating layer 116, and the third insulating layer 118 may be arranged in the first sub-peripheral area SPA1 by extending into the peripheral area PA from the display area DA. The second sub-peripheral area SPA2 may be a dam area where at least one dam DAM is disposed. The example embodiment of FIGS. 5 and 6 illustrate three dams DAM.

Referring to FIG. 5, and as also illustrated in FIG. 3, the driving voltage supply line 11 may be disposed in the peripheral area PA at the lower side portion of the display area DA. The driving voltage supply line 11 may be disposed in the first sub-peripheral area SPA1 and the second sub-peripheral area SPA2. The driving voltage supply line 11 may be disposed between the first insulating layer 115 and the second insulating layer 116 in the first sub-peripheral area SPA1, and on the interlayer insulating layer 113 in the second sub-peripheral area SPA2.

A plurality of holes 11H may be defined in the driving voltage supply line 11 located in the first sub-peripheral area SPA1. The holes 11H may function as an outgassing path through which a gas generated from the first insulating layer 115 is discharged to the outside. Accordingly, deterioration of quality of an image implemented in a display device due to a gas or moisture, and the like generated from the first insulating layer 115 and intruding into the display area DA may be prevented or reduced. The driving voltage supply line 11 may include the same material as one of the wirings disposed between the first insulating layer 115 and the second insulating layer 116 in the display area DA. For example, the driving voltage supply line 11 may include the same material as the data line DL disposed on the first insulating layer 115 of the display area DA.

At least one wiring may be further provided between the interlayer insulating layer 113 and the first insulating layer 115 in the first sub-peripheral area SPA1, overlapping the driving voltage supply line 11. The at least one wiring may include the same material as one of the wirings disposed in the display area DA between the interlayer insulating layer 113 and the first insulating layer 115. For example, the at least one wiring may include the same material as the driving voltage lines PL disposed on the interlayer insulating layer 113 of the display area DA.

The fan-out lines FW may be disposed in the peripheral area PA at the lower side portion of the display area DA. In an embodiment, as illustrated in FIG. 5, the fan-out lines FW may be disposed in different layers with at least one insulating layer therebetween. For example, a plurality of first fan-out lines FW1 above the first gate insulating layer 111 and a plurality of second fan-out lines FW2 above the second gate insulating layer 112 may be alternately disposed. Accordingly, a distance (e.g., spacing) between the fan-out lines FW neighboring each other may be reduced. In another embodiment, the fan-out lines FW may be disposed in the same layer. For example, the fan-out lines FW may be disposed on the first gate insulating layer 111 or on the second gate insulating layer 112. The fan-out lines FW may be disposed in the first sub-peripheral area SPA1 and the second sub-peripheral area SPA2.

The first scan driving circuit SDRV1 and the second scan driving circuit SDRV2 may be disposed in the first sub-peripheral area SPA1. Referring to FIG. 6, the first scan driving circuit SDRV1 may include a second thin film transistor TFT2 and a corresponding wiring associated with the second thin film transistors TFT2. The second thin film transistor TFT2 may be formed in the same process as the process of forming the first thin film transistor TFT1 of the pixel circuit PC. Accordingly, a detailed description about the second thin film transistor TFT2 is omitted. According to some example embodiments, a control signal line for applying a control signal to the first scan driving circuit SDRV1 may be further disposed in the sub-peripheral area SPA1. The control signal line may include signal lines for applying a clock signal, a reverse clock signal, a carry signal, and the like. The control signal line may be disposed in the same layer as the semiconductor layer ACT, the gate electrode GE, the upper electrode CE2 of the capacitor Cst, or the driving voltage lines PL.

As illustrated in FIG. 3, the common voltage supply line 13 may be disposed in the peripheral area PA at the left, right, and upper sides of the display area DA. The common voltage supply line 13 may be disposed in the first sub-peripheral area SPA1 and the second sub-peripheral area SPA2. The common voltage supply line 13 may be disposed between the first insulating layer 115 and the second insulating layer 116 in the first sub-peripheral area SPA1, and above the interlayer insulating layer 113 in the second sub-peripheral area SPA2.

A plurality of holes 13H may be defined in the common voltage supply line 13 located in the first sub-peripheral area SPA1. The holes 13H may function as an outgassing path through which a gas generated from the first insulating layer 115 is discharged to the outside. Accordingly, deterioration of quality of an image implemented in a display device due to a gas or moisture, and the like generated from the first insulating layer 115 and intruding into the display area DA may be prevented or reduced. In some embodiments, the holes 13H may be defined in an area adjacent to the display area DA in the common voltage supply line 13 disposed above the substrate 100. The common voltage supply line 13 may include the same material as one of the wirings disposed in the display area DA between the first insulating layer 115 and the second insulating layer 116. For example, the common voltage supply line 13 may include the same material as the data line DL disposed on the first insulating layer 115 of the display area DA. The common voltage supply line 13 may be disposed in the same layer as the driving voltage supply line 11, and may include the same material as the driving voltage supply line 11. The driving voltage supply line 11 and the common voltage supply line 13 may be provided apart from each other in the same layer.

A voltage line 17 may be further disposed in the second sub-peripheral area SPA2 between the common voltage supply line 13 and the interlayer insulating layer 113. A part of the common voltage supply line 13 located in the second sub-peripheral area SPA2 may overlap the voltage line 17 and may be in direct contact with the voltage line 17. The voltage line 17 may include the same material as one of the wirings disposed in the display area DA between the interlayer insulating layer 113 and the first insulating layer 115. For example, the voltage line 17 may include the same material as the driving voltage lines PL disposed on the interlayer insulating layer 113 of the display area DA. The common voltage supply line 13 may transmit the common voltage ELVSS applied from the voltage line 17 to the second electrode 223 via an auxiliary line 19.

The auxiliary line 19 may be disposed in the first sub-peripheral area SPA1 and in the second sub-peripheral area SPA2. The auxiliary line 19 may be located on the second insulating layer 116 in the first sub-peripheral area SPA1 and on the common voltage supply line 13 in the second sub-peripheral area SPA2. A part of the auxiliary line 19 located on the first sub-peripheral area SPA1 may be connected to the second electrode 223. For example, the second electrode 223 may be in direct contact with the auxiliary line 19 exposed by a hole defined in the third insulating layer 118 located in the first sub-peripheral area SPA1. In the second sub-peripheral area SPA2, a part of the auxiliary line 19 may overlap the common voltage supply line 13 and may be in direct contact with the common voltage supply line 13. In the second sub-peripheral area SPA2, a part of the auxiliary line 19 may be located between a plurality of layers forming the dam DAM. A hole 19H that exposes a part of an upper surface of a layer located below the auxiliary line 19 may be defined in the auxiliary line 19 located inside the dam DAM. The auxiliary line 19 may include the same material as one of the wirings disposed between the second insulating layer 116 and the third insulating layer 118 in the display area DA. For example, the auxiliary line 19 may include the same material as the first electrode 221 disposed on the second insulating layer 116 in the display area DA.

The driving voltage supply line 11 and the common voltage supply line 13 may be located above an inorganic layer. For example, the driving voltage supply line 11 and the common voltage supply line 13 may be disposed above an inorganic insulating layer including at least one of the buffer layer 110, the first gate insulating layer 111, the second gate insulating layer 112, or the interlayer insulating layer 113.

When forming the organic encapsulation layer 320 according to some embodiment, a material for forming the organic encapsulation layer 320 may be located in a preset area. To this end, at least one dam DAM may be provided in the peripheral area PA. As illustrated in FIG. 7, the dam DAM may be provided in the form of a line surrounding the display area DA. By way of example, FIGS. 5 to 7 illustrate three dams, that is, first to third dams DAM1, DAM2, and DAM3. However, the number of dams DAM may vary. The first to third dams DAM1, DAM2, and DAM3 may be disposed between the display area DA of the substrate 100 and the terminal portion PAD of FIG. 3. The first to third dams DAM1, DAM2, and DAM3 may be located above the inorganic layer. For example, the first to third dams DAM1, DAM2, and DAM3 may be disposed above the inorganic insulating layer including at least one of the buffer layer 110, the first gate insulating layer 111, the second gate insulating layer 112, or the interlayer insulating layer 113.

The first dam DAM1 may be provided in the second sub-peripheral area SPA2. In the second sub-peripheral area SPA2, the second dam DAM2 that is disposed relatively closer to the display area DA than the first dam DAM1 may be provided between the first dam DAM1 and the first sub-peripheral area SPA1. In the second sub-peripheral area SPA2, the third dam DAM3 relatively closer to the display area DA than the first dam DAM1 may be provided between the second dam DAM2 and the first sub-peripheral area SPA1.

The first inorganic encapsulation layer 310 and the second inorganic encapsulation layer 330 may cover the first to third dams DAM1, DAM2, and DAM3 and may be formed at the outer side of the first to third dams DAM1, DAM2, and DAM3. As the location of the organic encapsulation layer 320 is limited by the first to third dams DAM1, DAM2, and DAM3, a material for forming the organic encapsulation layer 320 may be prevented from overflowing to the outside of the first to third dams DAM1, DAM2, and DAM3.

At least parts of the first to third dams DAM1, DAM2, and DAM3 may be disposed above the power supply line, for example, the driving voltage supply line 11 and/or the common voltage supply line 13. The first to third dams DAM1, DAM2, and DAM3 may be disposed in the lower side of the display area DA in the second sub-peripheral area SPA2 and extending in the x direction, as illustrated in FIG. 8A. The first to third dams DAM1, DAM2, and DAM3 may be disposed in the left and right sides of the display area DA in the second sub-peripheral area SPA2 and extending in the y direction, as illustrated in FIG. 8B. In some embodiments, the first to third dams DAM1, DAM2, and DAM3 may be disposed in the upper side of the display area DA in the second sub-peripheral area SPA2 and extending in the x direction.

In some embodiments, each of the dams DAM may have a multilayer structure having a plurality of layers. For the dam DAM to function as a wall (e.g., position limitation for a material) for forming an organic encapsulation layer, the height of the first dam DAM1 located at the outermost side may be relatively greater (e.g., higher) than the heights of the second and third dams DAM2 and DAM3. The first dam DAM1 located at the outermost side of the display area DA may have more layers than the second and third dams DAM2 and DAM3, such that the height of the first dam DAM1 is greater than the heights of the second and third dams DAM2 and DAM3. For example, the second and third dams DAM2 and DAM3 each may include two layers: a first layer 116D that is the lowermost layer stacked in a direction away from the upper surface of the substrate 100 (that is, in the z direction), and a second layer 118D on the first layer 116D. The first dam DAM1 may include three layers: the first layer 116D that is the lowermost layer stacked in the z direction, the second layer 118D on the first layer 116D, and a third layer 119D on the second layer 118D.

Each of the dams DAM may include a plurality of organic insulating layers. For example, the first layer 116D may be formed of the same material as the second insulating layer 116 in the display area DA concurrently (e.g., simultaneously) during the formation of the second insulating layer 116. The second layer 118D may be formed of the same material as the third insulating layer 118 in the display area DA concurrently (e.g., simultaneously) during the formation of the third insulating layer 118. The third layer 119D may be formed of the same material as the spacer SPC in the display area DA concurrently (e.g., simultaneously) during the formation of the spacer SPC.

As illustrated in FIG. 6, the auxiliary line 19 may be located between the first layer 116D and the second layer 118D of each of the first to third dams DAM1, DAM2, and DAM3 to cover the first layer 116D. The hole 19H for exposing a part of the upper surface of the first layer 116D may be defined in the auxiliary line 19. The hole 19H may function as an outgassing path through which the gas generated from the first layer 116D is discharged to the outside.

A first dam DAM1' according to a comparative example illustrated in FIG. 9 may include three layers, a first layer L1, a second layer L2, and a third layer L3, which are disposed on an inorganic insulating layer IL and concurrently (e.g., simultaneously) formed of the same materials as those of the first insulating layer 115, the second insulating layer 116, and the third insulating layer 118, as illustrated in FIGS. 5 and 6. As the first layer L1 that is the lowermost layer of the first dam DAM1' according to a comparative example is formed concurrently (e.g., simultaneously) during the formation of the first insulating layer 115, the power supply line, for example, a driving voltage supply line 11' and/or a common voltage supply line 13', which are formed concurrently (e.g., simultaneously) during the formation of the data line DL of the display area DA, may be formed on the first layer L1. In other words, the driving voltage supply line 11' and/or the common voltage supply line 13' is provided to cover the first layer L1 between the first layer L1 and the second layer L2. Accordingly, as gas generated from the first layer L1 does not escape, the bubbles generated from the gas may cause a defect where the driving voltage supply line 11' and/or the common voltage supply line 13' are lift. When the area of the first layer L1 is reduced to decrease the amount of generated gas, a taper angle of the first layer L1 increases, and a defect where the driving voltage supply line 11' and/or the common voltage supply line 13' are short-circuited may occur.

In an embodiment, as the first layer 116D that is formed concurrently (e.g., simultaneously) during the formation of the second insulating layer 116 is formed as the lowermost layer of the first dam DAM1 (that is, the outermost dam), the driving voltage supply line 11 and/or the common voltage supply line 13 may be located in the lower side of the first dam DAM1. Accordingly, when compared with the first dam DAM1' according to the comparative example of FIG. 9, there is no dam height loss. Additionally, the organic insulating layer does not exist below the driving voltage supply line 11 and/or the common voltage supply line 13, and therefore a defect such as lifting or a short-circuit of the driving voltage supply line 11 and/or the common voltage supply line 13 may be prevented.

In the above-described embodiment, as illustrated in FIG. 7, the dams DAM are formed along the edge of the substrate 100 surrounding the display area DA. In another embodiment, as illustrated in FIG. 10, the dams DAM may be formed only in the lower side portion of the display area DA in the x direction. The first to third dams DAM1, DAM2, and DAM3 may be provided above the driving voltage supply line 11 and/or the common voltage supply line 13. In another embodiment, the first to third dams DAM1, DAM2, and DAM3 in the upper side portion of the display area DA, the first to third dams DAM1, DAM2, and DAM3 in the lower side portion thereof, the first to third dams DAM1, DAM2, and DAM3 in the left side portion thereof, and the first to third dams DAM1, DAM2, and DAM3 in the right side portion thereof may be separately arranged for each area.

Although FIG. 4 illustrates that the transistors of the pixel circuit are P-type transistors according to one embodiment, the disclosure is not limited thereto. For example, the transistors of the pixel circuit may be N-type transistors as illustrated in FIG. 11, some transistors may be P-type transistors and the other transistors may be N-type transistors, and various embodiments are possible.

Figure 11:
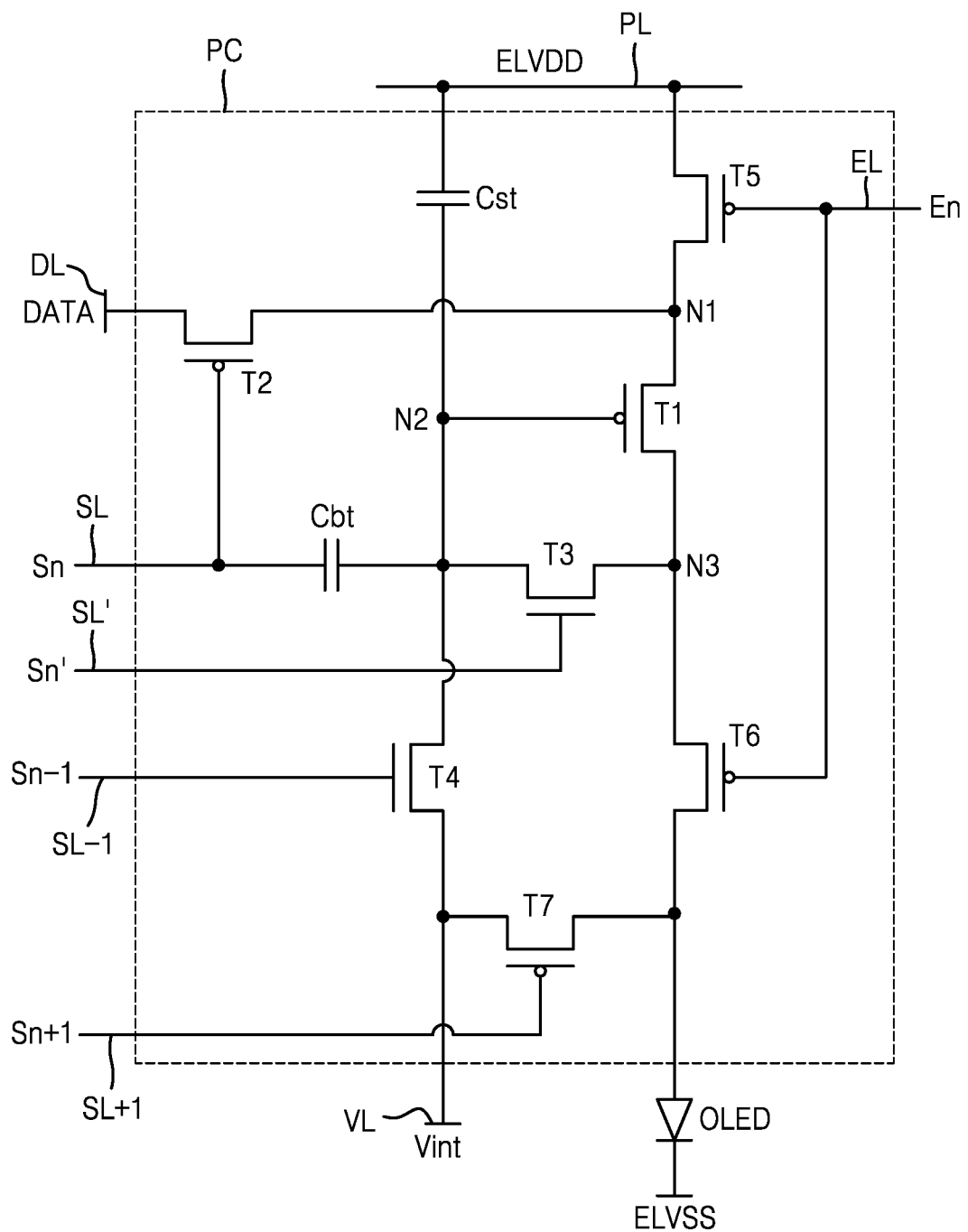
FIG. 11 is an equivalent circuit diagram of a pixel according to an embodiment.

FIG. 11 is an equivalent circuit diagram of a pixel according to an embodiment.

The pixel circuit PC of FIG. 11 is different from the pixel circuit of FIG. 4 in that the third transistor T3 and the fourth transistor T4 of the first to seventh transistors T1 to T7 are implemented as n-channel MOSFET (NMOS) transistors, and the other is implemented as p-channel MOSFET (PMOS) transistors. In the following description, differences from the pixel circuit of FIG. 4 are mainly described.

Referring to FIG. 11, the third transistor T3 may include a gate terminal connected to a fourth scan line SL', a first terminal connected to the second node N2, and a second terminal connected to the third node N3. The third transistor T3 may be turned on according to a fourth scan signal Sn' received through the fourth scan line SL', which is diode-connected to the first transistor T1. According to an embodiment, the third transistor T3 is turned on by the fourth scan signal Sn' at the same time as when the second transistor T2 is turned on by the first scan signal Sn.

The pixel circuit PC may include a first capacitor Cst and a second capacitor Cbt. The first capacitor Cst may include a first electrode connected to the second node N2 and a second electrode connected to the driving voltage lines PL. The second capacitor Cbt may include the first scan line SL, a third electrode connected to a gate electrode of the second transistor T2, and a fourth electrode connected to the second node N2. The second capacitor Cbt, as a boosting capacitor, may decrease a voltage (e.g., black voltage) displaying black by increasing a voltage of the second node N2, when the first scan signal Sn of the first scan line SL is a voltage that turns the second transistor T2 off.

In the present embodiment, in the pixel circuit PC, at least one of the first to seventh transistors T1 to T7 includes a semiconductor layer including an oxide, and the others include a semiconductor layer including silicon. In more detail, for the first transistor T1 directly affecting the brightness of a display device, a semiconductor layer including polycrystal silicon having higher reliability is included, and thus, a high-resolution display device may be implemented.

Because an oxide semiconductor has higher carrier mobility and a lower leakage current, even when a driving time is long, a voltage drop is not great. In other words, during low frequency driving, as the color of an image due to the voltage drop does not change much, low frequency driving is possible. As such, for an oxide semiconductor, leakage current is low, and thus by employing an oxide semiconductor for at least one of the third transistor T3 or the fourth transistor T4 connected to the gate electrode of the first transistor T1, the leakage current that may flow toward the gate electrode of the first transistor T1 may be reduced or prevented and power consumption may be reduced concurrently (e.g., simultaneously).

Figure 12:
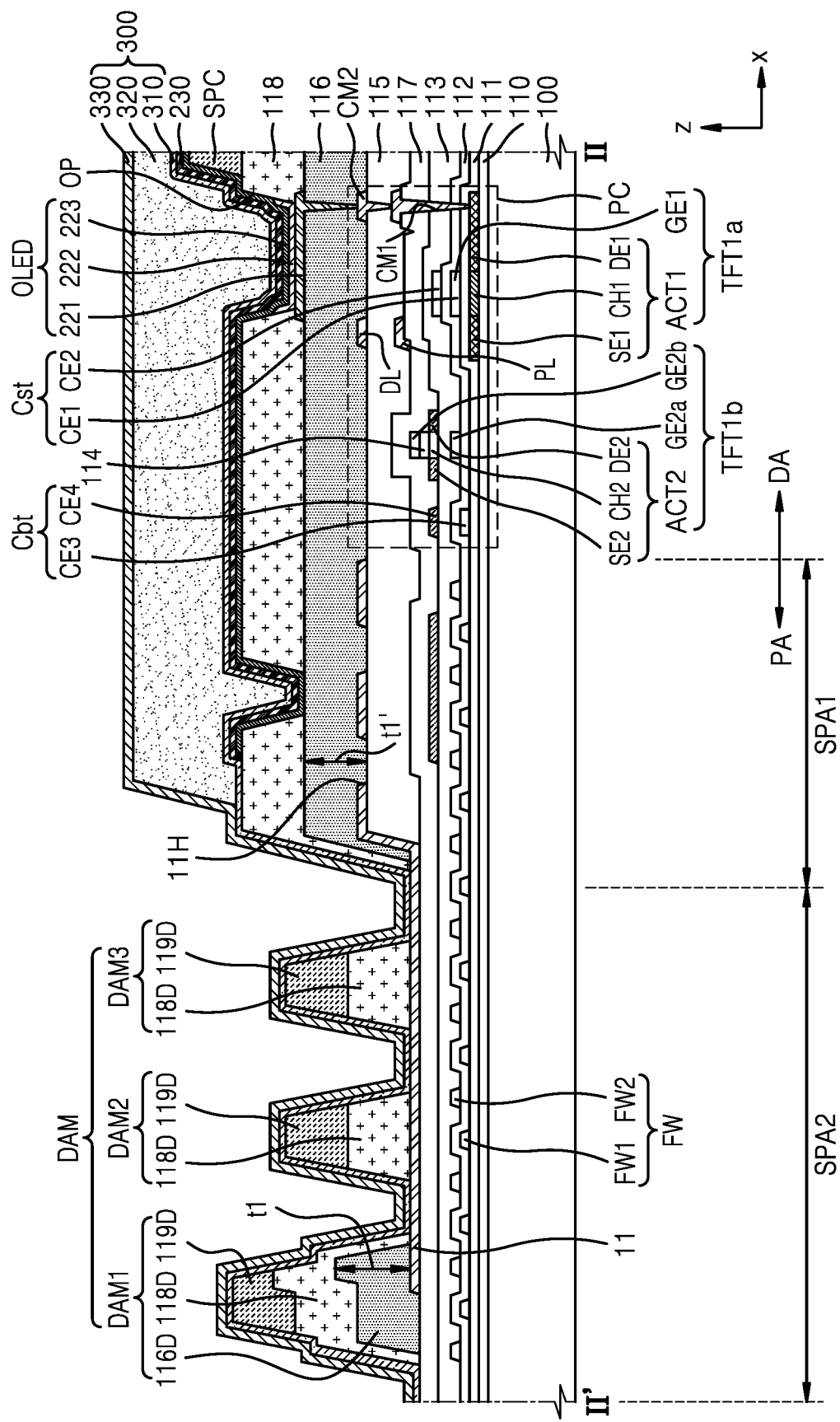
FIG. 12 is a cross-sectional view of a portion of a display panel taken along the line II-II' FIG. 3.
Figure 13:
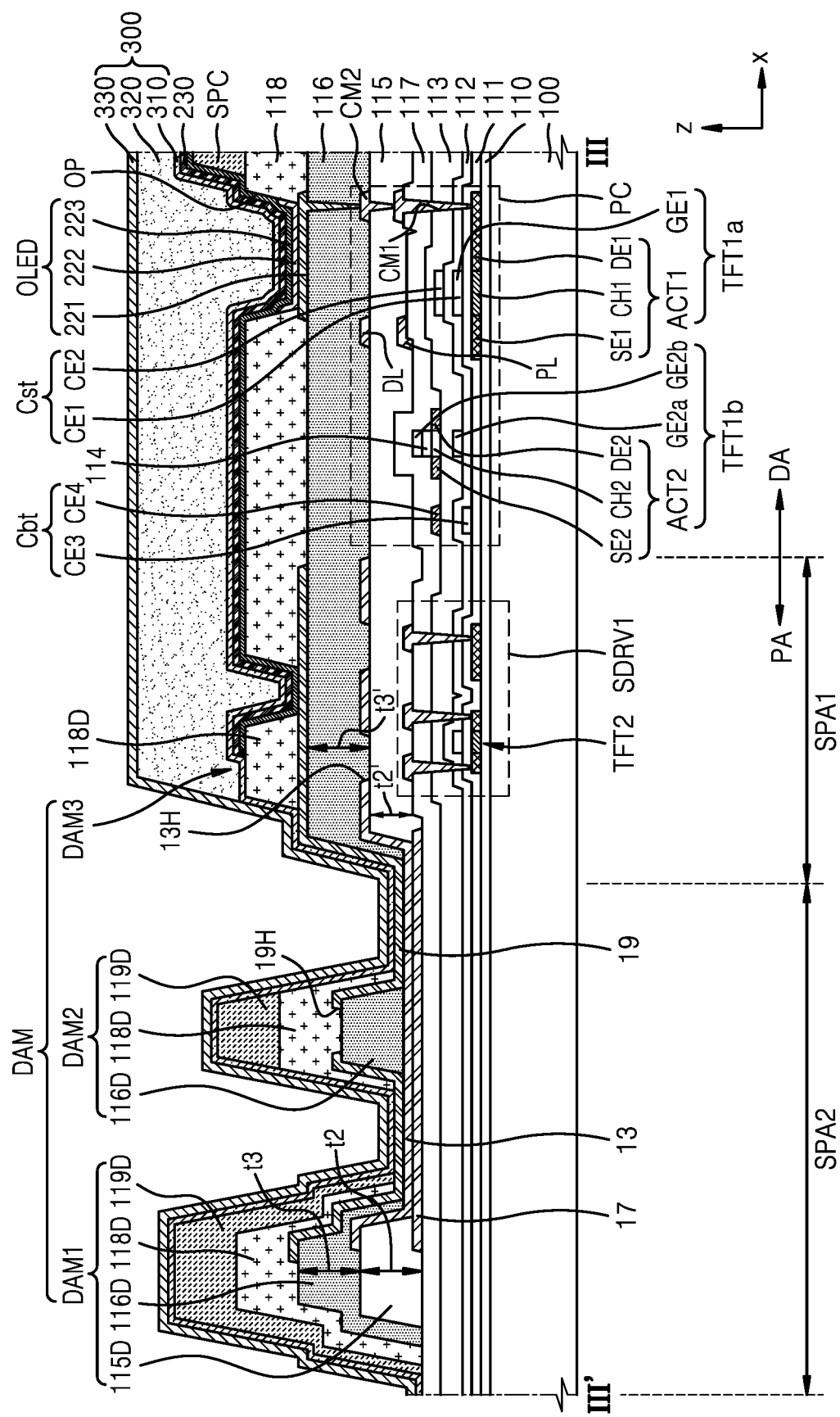
FIG. 13 is a cross-sectional view of a portion of a display panel taken along the line III-III' of FIG. 3.

FIG. 12 is a cross-sectional view of a portion of the display panel 10 taken along the line II-1I' FIG. 3. FIG. 13 is a cross-sectional view of a portion of the display panel 10 taken along line the III-III' of FIG. 3. FIGS. 12 and 13 may be cross-sectional views of the display panel 10, to which the pixel of FIG. 11 is applied. In the following description, descriptions redundant to the above descriptions with reference to FIGS. 5 to 10 are omitted, and the differences in the configurations are mainly described.

First, referring to the display area DA of FIGS. 12 and 13, the pixel circuit PC and the OLED electrically connected to the pixel circuit PC may be arranged in the display area DA of the substrate 100. The pixel circuit PC may include a first-1 thin film transistor TFT1a, a first-2 thin film transistor TFT1b, the first capacitor Cst, and the second capacitor Cbt.

The first-1 thin film transistor TFT1a may be a transistor including a semiconductor layer including silicon among the transistor described with reference to FIG. 11, for example, the first transistor T1 that is a driving transistor. The first-2 thin film transistor TFT1b may be a transistor including an oxide semiconductor layer among the transistors described with reference to FIG. 11, for example, the third transistor T3 or the fourth transistor T4. The first-1 thin film transistor TFT1a may include a semiconductor layer ACT1, a gate electrode GE1, a source electrode SE1, and a drain electrode DE1. The first-2 thin film transistor TFT1b may include a semiconductor layer ACT2, a lower gate electrode GE2a, an upper gate electrode GE2b, a source electrode SE2, and a drain electrode DE2. The semiconductor layer ACT1 may include amorphous silicon or polycrystal silicon, and the semiconductor layer ACT2 may include an oxide semiconductor material. An insulating layer 114 may be disposed, as a dielectric layer, between the semiconductor layer ACT2 and the upper gate electrode GE2b.

The first capacitor Cst may include the lower electrode CE1 and the upper electrode CE2 overlapping each other with the second gate insulating layer 112 therebetween. The second capacitor Cbt may include a lower electrode CE3 and an upper electrode CE4 overlapping each other with the first gate insulating layer 111 and the second gate insulating layer 112 therebetween. The second capacitor Cbt may be covered with a second interlayer insulating layer 117. The second interlayer insulating layer 117 may include an inorganic material having an oxide or a nitride. For example, a second interlayer insulating layer 117 may include at least one of a silicon oxide ($SiO_2$), a silicon nitride ($SiNx$), a silicon oxynitride ($SiON$), an aluminum oxide ($Al_2O_3$), a titanium oxide ($TiO_2$), a tantalum oxide ($Ta_2O_5$), a hafnium oxide ($HfO_2$), a zinc oxide ($ZnO_2$), or the like.

The driving voltage lines PL and the first connection electrode CM1 may be disposed on the second interlayer insulating layer 117. The first insulating layer 115 may be disposed above the driving voltage lines PL and the first connection electrode CM1.

The peripheral area PA of FIG. 12 may correspond to a part of the lower side portion of the display area DA of FIG. 3, and the peripheral area PA of FIG. 13 may correspond to a part of the left or right side portions of the display area DA of FIG. 3.

As illustrated in FIG. 12, the dams DAM, for example, three dams that are the first to third dams DAM1, DAM2, and DAM3, may be provided in the second sub-peripheral area SPA2 of the lower side portion of the display area DA. The first to third dams DAM1, DAM2, and DAM3 may be located above the inorganic layer. For example, the first to third dams DAM1, DAM2, and DAM3 may be arranged above the inorganic insulating layer including at least one of the buffer layer 110, the first gate insulating layer 111, the second gate insulating layer 112, the interlayer insulating layer 113, or the second interlayer insulating layer 117.

At least parts of the first to third dams DAM1, DAM2, and DAM3 may be disposed above the power supply line, for example, the driving voltage supply line 11 and/or the common voltage supply line 13. The first dam DAM1 that is the outermost dam partially overlaps end portions of the driving voltage supply line 11 and the common voltage supply line 13 such that the lowermost layer of the first dam DAM1 has a step. In another embodiment, the first dam DAM1 entirely overlaps the driving voltage supply line 11 and the common voltage supply line 13 such that the lowermost layer of the first dam DAM1 has a step.

The first to third dams DAM1, DAM2, and DAM3 each may have a multilayer structure including a plurality of organic insulating layers. The first dam DAM1 may have more layers than the second and third dams DAM2 and DAM3 such that the height of the first dam DAM1 that is the outermost dam is greater (e.g., higher) than the heights of the second and third dams DAM2 and DAM3.

The second dam DAM2 and the third dam DAM3 each may include two layers: a first layer 118D that is the lowermost layer stacked in the z direction and a second layer 119D on the first layer 118D. The first layer 118D may be concurrently (e.g., simultaneously) formed of the same material as the third insulating layer 118 in the display area DA during the formation of the third insulating layer 118. The second layer 119D may be concurrently (e.g., simultaneously) formed of the same material as the spacer SPC in the display area DA during the formation of the spacer SPC.

The first dam DAM1 may include three layers: the first layer 116D that is the lowermost layer stacked in the z direction, the second layer 118D on the first layer 116D, and the third layer 119D on the second layer 118D. The first layer 116D may be formed of the same material as the second insulating layer 116 in the display area DA concurrently (e.g., simultaneously) during the formation of the second insulating layer 116. The second layer 118D may be formed of the same material as the third insulating layer 118 in the display area DA concurrently (e.g., simultaneously) during the formation of the third insulating layer 118. The third layer 119D may be formed of the same material as the spacer SPC in the display area DA concurrently (e.g., simultaneously) during the formation of the spacer SPC. The first layer 116D of the first dam DAM1 and the second insulating layer 116 may be formed by using a half-tone mask to have different thicknesses. For example, a thickness t1 of the thickest portion of the first layer 116D may be less than a thickness t1' of the thickest portion of the second insulating layer 116.

As illustrated in FIG. 13, the dams DAM, for example, two layers of the first and second dams DAM1 and DAM2, may be provided in the second sub-peripheral area SPA2 of the left, right, and upper sides of the display area DA. The third dam DAM3 may be provided in the first sub-peripheral area SPA1 of the left, right, and upper sides of the display area DA.

At least parts of the first and second dams DAM1 and DAM2 may be arranged above the common voltage supply line 13. The first and second dams DAM1 and DAM2 each may have a multilayer structure and include a plurality of organic insulating layers. The first dam DAM1 may have more layers than the second and third dams DAM2 and DAM3 such that the height of the first dam DAM1 that is the outermost dam is greater (e.g., higher) than the heights of the second and third dams DAM2 and DAM3. For example, the third dam DAM3 may have a single layer, the second dam DAM2 may have three layers, and the first dam DAM1 may have four layers.

The third dam DAM3 may include an upper layer 118D disposed above the first insulating layer 115 and the second insulating layer 116 in the first sub-peripheral area SPA1. A part of the first insulating layer 115 and the second insulating layer 116 in the first sub-peripheral area SPA1, overlapping the upper layer 118D of the third dam DAM3, may be understood as a part of the third dam DAM3. For example, in the first sub-peripheral area SPA1, the first insulating layer 115 and the second insulating layer 116, overlapping the upper layer 118D of the third dam DAM3, each may function as the lower layers of the third dam DAM3. The upper layer 118D of the third dam DAM3 may be formed of the same material as the third insulating layer 118 in the display area DA simultaneously during the formation of the third insulating layer 118. The third dam DAM3 may be formed such that it surrounds the left, upper, and right sides of the display area DA, or it may be formed such that they are separately arranged in each of the left, upper, and right sides of the display area DA.

The second dam DAM2 may include the first layer 116D that is a lowermost layer stacked in the z direction, the second layer 118D on the first layer 116D, and the third layer 119D on the second layer 118D. The first layer 116D may be formed of the same material as the second insulating layer 116 in the display area DA concurrently (e.g., simultaneously) during the formation of the second insulating layer 116. The second layer 118D may be formed of the same material as the third insulating layer 118 in the display area DA concurrently (e.g., simultaneously) during the formation of the third insulating layer 118. The third layer 119D may be formed of the same material as the spacer SPC in the display area DA concurrently (e.g., simultaneously) during the formation of the spacer SPC.

The first dam DAM1 may include a first layer 115D that is a lowermost layer stacked in the z direction, a second layer 116D on the first layer 115D, a third layer 118D on the second layer 116D, and a fourth layer 119D on the third layer 118D. The first layer 115D may be formed of the same material as the first insulating layer 115 in the display area DA concurrently (e.g., simultaneously) during the formation of the first insulating layer 115. The second layer 116D may be formed of the same material as the second insulating layer 116 in the display area DA concurrently (e.g., simultaneously) during the formation of the second insulating layer 116. The third layer 118D may be formed of the same material as the third insulating layer 118 in the display area DA concurrently (e.g., simultaneously) during the formation of the third insulating layer 118. The fourth layer 119D may be formed of the same material as the spacer SPC in the display area DA concurrently (e.g., simultaneously) during the formation of the spacer SPC.

As an end portion of the common voltage supply line 13 is disposed between the first layer 115D and the second layer 116D of the first dam DAM1, the common voltage supply line 13 may cover only a part of the first layer 115D. Accordingly, an outgassing path through which the gas generated from the first layer 115D is discharged to the outside may be formed.

The first layer 115D of the first dam DAM1 and the first insulating layer 115 may be formed to have different thicknesses. For example, a thickness t2 of the thickest portion of the first layer 115D may be less than a thickness t2' of the thickest portion of the first insulating layer 115. The second layer 116D of the first dam DAM1 and the second insulating layer 116 may be formed to have different thicknesses by using a half-tone mask. For example, a thickness t3 of the thickest portion of the second layer 116D may be less than a thickness t3' of the thickest portion of the second insulating layer 116.

The first dam DAM1 provided in the lower side of the display area DA and the first dam DAM1 provided in the left, right, and upper sides of the display area DA may have a step. In some embodiments, because the first to fourth layers 115D, 116D, 118D, and 119D forming the first dam DAM1 has a step (e.g., surface step), the first dam DAM1 may have a step. For example, the first dam DAM1 of FIG. 12 may have a step because the first layer 116D and the second layer 118D have steps. The first dam DAM1 of FIG. 13 may have a step because the second layer 116D and the third layer 118D have steps. In another embodiment, the first layer 115D of the first dam DAM1 of FIG. 13 may also have a step.

The first layer 116D of the first dam DAM1 of FIG. 12 may be disposed to partially overlap an end portion of the driving voltage supply line 11, and the first layer 115D of the first dam DAM1 of FIG. 13 may be disposed to partially overlap an end portion of the voltage line 17. Accordingly, the first layers 116D and 115D of the first dam DAM1 may have a step. Furthermore, as the end portion of the common voltage supply line 13 partially covers the upper portion of the first layer 115D of the first dam DAM1 of FIG. 13, the second to fourth layers 116D, 118D, and 119D each may have a step. In another embodiment, the step of an insulating layer may be implemented by using a half-tone mask.

In some embodiments, as the location of the organic encapsulation layer 320 is limited by the first to third dams DAM1, DAM2, and DAM3, a material for forming the organic encapsulation layer 320 may be prevented from overflowing outside of the first to third dams DAM1, DAM2, and DAM3

Figure 14:
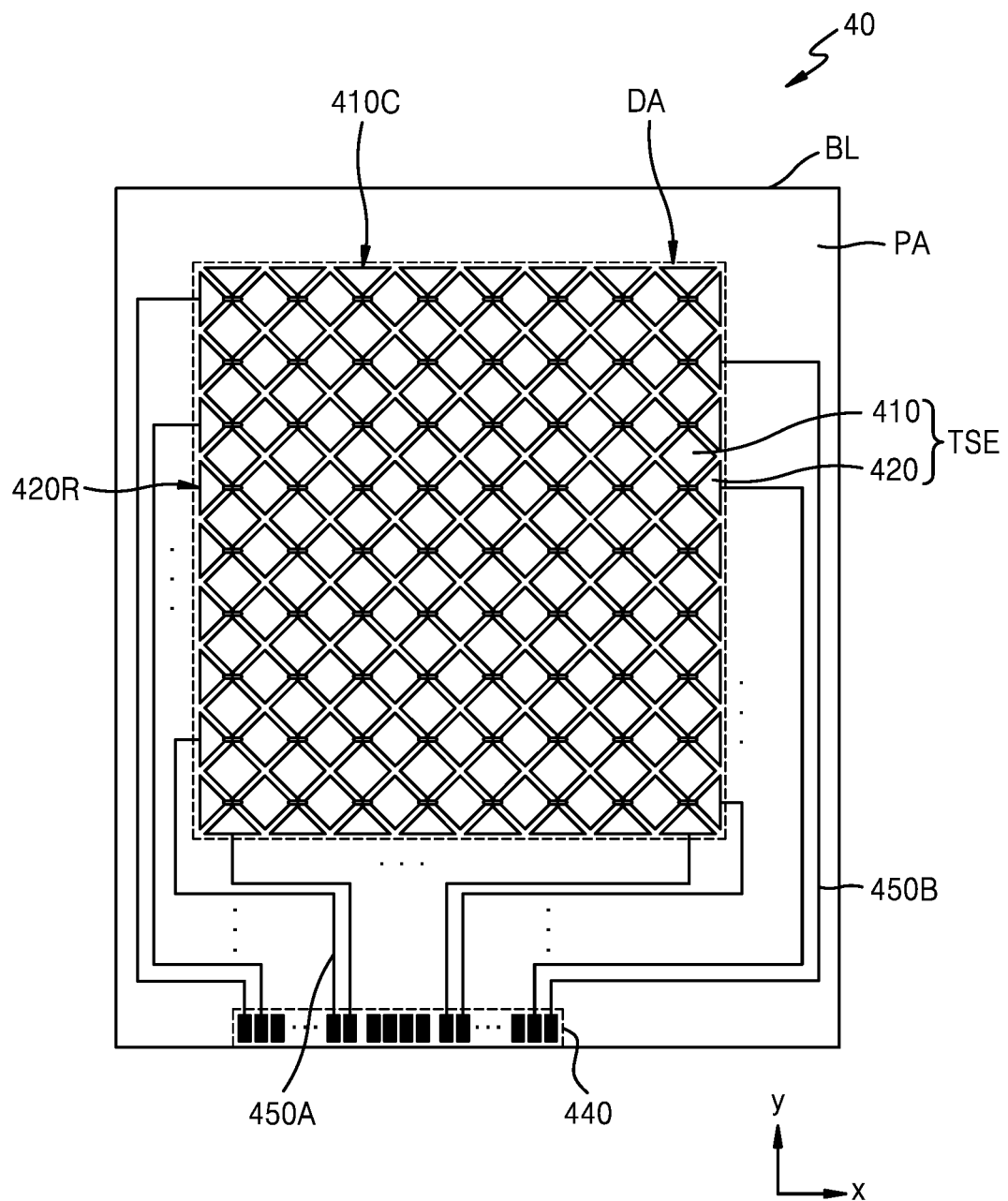
FIG. 14 is a schematic plan view of an input sensing layer according to an embodiment.

FIG. 14 is a schematic plan view of the input sensing layer 40 according to an embodiment.

Referring to FIG. 14, the input sensing layer 40 may include a base layer BL including the display area DA and the peripheral area PA. The base layer BL may correspond to the shape of the substrate 100 of the display panel 10, and may be substantially provided in the same shape as the substrate 100. In an embodiment, the base layer BL may be a part of the encapsulation layer 300 (see, e.g., FIGS. 12 and 13) of the display panel 10, for example, the second inorganic encapsulation layer 330 disposed in the uppermost layer of the encapsulation layer 300. In another embodiment, the base layer BL may be an insulating layer, an insulating substrate, or an insulating film dispose above the encapsulation layer 300, aside from the encapsulation layer 300.

A plurality of sensing electrodes TSE may be disposed in the display area DA. Sensing signal lines connected to the sensing electrodes TSE may be disposed in the peripheral area PA. The sensing electrodes TSE may include a first sensing electrode 410 and a second sensing electrode 420. The sensing signal line may include a first sensing signal line 450A and a second sensing signal line 450B. In other words, the input sensing layer 40 may include the first sensing electrodes 410, the first sensing signal lines 450A connected to the first sensing electrodes 410, the second sensing electrodes 420, and the second sensing signal lines 450B connected to the second sensing electrodes 420. The input sensing layer 40 may sense an external input by a mutual cap method or/and a self-cap method.

The first sensing electrodes 410 and the second sensing electrodes 420 each may have a roughly diamond shape. The first sensing electrodes 410 and the second sensing electrodes 420 may have a grid structure (or a lattice structure) having a plurality of holes. The linewidth of each grid line may be about several micrometers. The holes of the first sensing electrodes 410 and the second sensing electrodes 420 may correspond to the emission area of an OLED.

The first sensing electrodes 410 may be arranged in they direction, and the second sensing electrodes 420 may be arranged in the x direction intersecting with the y direction. The first sensing electrodes 410 arranged in the y direction may be connected to each other by a connection electrode between the first sensing electrodes 410 neighboring each other, thereby forming a first sensing line 410C. The second sensing electrodes 420 arranged in the x direction may be connected to each other by a connection electrode between the second sensing electrodes 420 neighboring each other, thereby forming a second sensing line 420R. The first sensing lines 410C and the second sensing lines 420R may intersect with each other. For example, the first sensing lines 410C and the second sensing lines 420R may be perpendicular to each other.

The first sensing lines 410C and the second sensing lines 420R may be arranged in the display area DA and connected to a sensing signal pad 440 through the first sensing signal lines 450A and the second sensing signal lines 450B which are formed in the peripheral area PA. The first sensing lines 410C each may be connected to the first sensing signal lines 450A, and the second sensing lines 420R each may be connected to the second sensing signal lines 450B.

The first sensing electrode 410 and the second sensing electrode 420 may be formed in the same layer. The first sensing electrodes 410 may be connected to each other by the connection electrodes formed on another layer. The second sensing electrode 420 may be connected to each other by the connection electrodes formed in the same layer. At least one insulating layer may be disposed between the connection electrodes arranged in a layer different from the first and second sensing electrodes 410 and 420.

The first sensing electrodes 410 and the second sensing electrodes 420 each may include metal. For example, the first sensing electrodes 410 and the second sensing electrodes 420 each may include Mo, Al, Cu, T1, and the like, and may be formed in a multilayer or single layer including the above material(s). In an embodiment, the first sensing electrodes 410 and the second sensing electrodes 420 each may be formed in a multilayer of Ti/Al/Ti.

Figure 15:
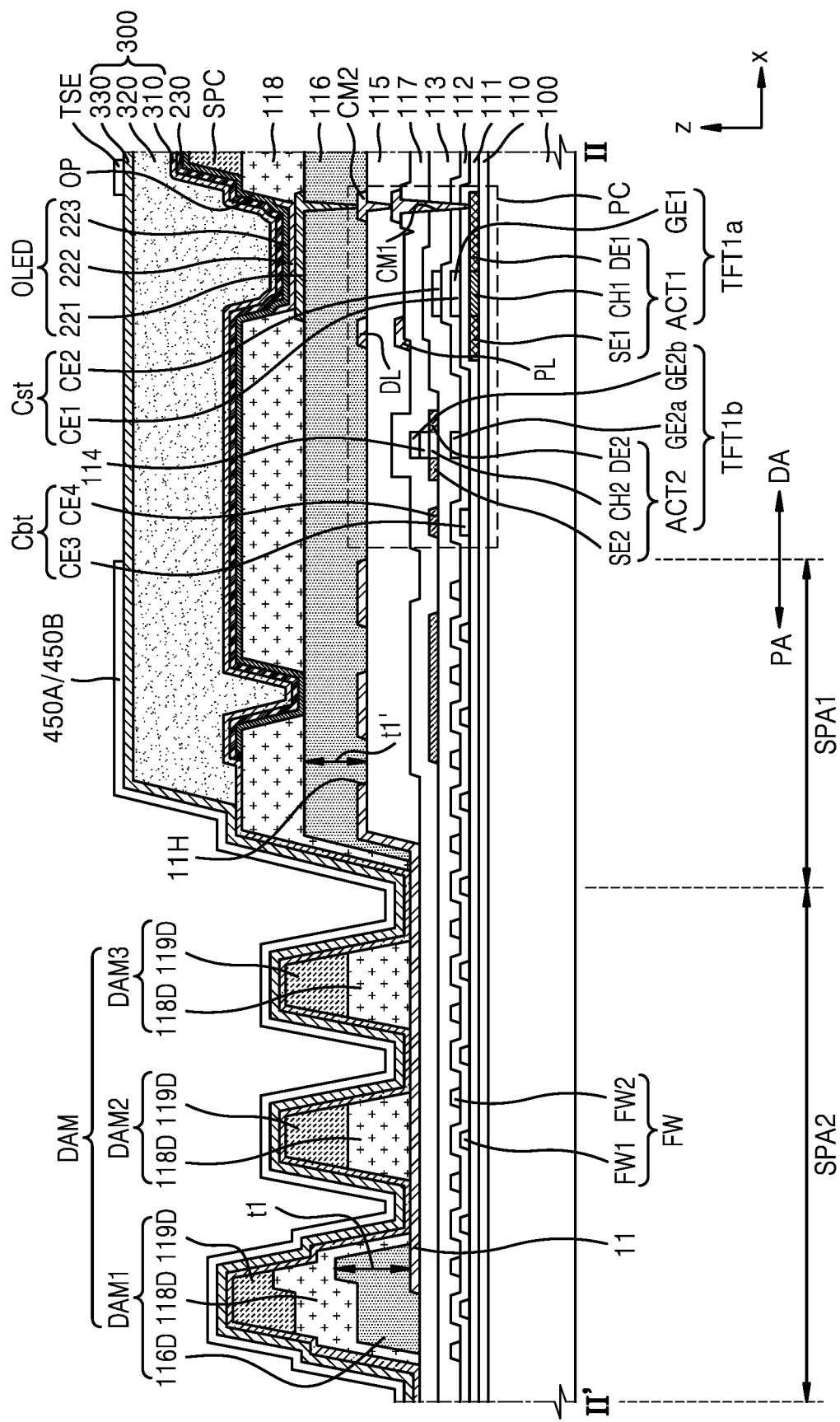
FIG. 15 is a cross-sectional view of a portion of a display panel according to an embodiment.

FIG. 15 is a cross-sectional view of a portion of the display panel 10 according to an embodiment. FIG. 15 illustrates an example in which the input sensing layer 40 of FIG. 14 is disposed on the display panel 10 of the lower side portion of the display area DA of FIG. 12.

The input sensing layer 40 may be disposed above the second inorganic encapsulation layer 330. The sensing electrodes TSE of the input sensing layer 40 may be disposed in the display area DA. The first sensing signal line 450A and the second sensing signal line 450B, which are sensing signal lines connected to the sensing electrodes TSE, may be disposed in the peripheral area PA. The sensing signal lines may extend by passing over the first to third dams DAM1, DAM2, and DAM3. In the present embodiment, as the first dam DAM1, that is the highest one (e.g., higher relative to the first dam and second dam DAM1 and DAM2), has a step, a short-circuit defect of the sensing signal lines passing over the first to third dams DAM1, DAM2, and DAM3 may be prevented.

In some embodiments, increasing the thickness of the second insulating layer 116 in the display area DA may be considered to reduce noise between the input sensing layer 40 and the display area DA of the display panel 10. In this case, due to the increase in the thickness of the second insulating layer 116, the height of the first dam DAM1 including the first layer 116D concurrently (e.g., simultaneously) formed with the second insulating layer 116 in the peripheral area PA is increased, and thus a short-circuit defect of the sensing signal lines may be generated.

In the present embodiment, as illustrated in FIGS. 12 and 13, as the thicknesses t1 and t3 of some layers, for example, the first layer 116D, of the first dam DAM1 that is formed in the display area DA concurrently (e.g., simultaneously) during the formation of the second insulating layer 116, are formed to be less than the thicknesses t1' and t3' of the second insulating layer 116 of the display area DA, a short-circuit defect of the sensing signal lines may be prevented by reducing the height of the first dam DAM1.

Furthermore, as illustrated in FIG. 13, as the thickness t2 of some layers, for example, the first layer 115D, of the first dam DAM1 that is formed in the display area DA concurrently (e.g., simultaneously) during the formation of the first insulating layer 115, is formed to be less than the thickness t2' of the first insulating layer 115 of the display area DA, a short-circuit defect of the sensing signal lines may be prevented by reducing the height of the first dam DAM1.

In the present embodiment, the difference in thickness between the first insulating layer 115 and the second insulating layer 116 of the display area DA and the first layers 115D and 116D forming the first dam DAM1 may be implemented by using a half-tone mask.

According to one or more embodiments, by preventing a defect of the power supply line disposed in the peripheral area to supply power to the pixels of a display area, a display device capable of preventing or reducing the deterioration of image quality may be implemented. The scope of the disclosure is not limited by the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display device comprising:
a substrate comprising a display area and a peripheral area surrounding the display area;
a thin film transistor in the display area of the substrate;
a first insulating layer on the substrate, the first insulating layer covering the thin film transistor and comprising an organic insulating material;
a signal line on the first insulating layer, the signal line being coupled to the thin film transistor;
a second insulating layer on the first insulating layer, the second insulating layer covering the signal line and comprising an organic insulating material;
a power supply line in the peripheral area of the substrate, the power supply line configured to supply power to a pixel circuit comprising the thin film transistor; and
at least one dam, each of the at least one dam being on the power supply line and overlapping at least a part of the power supply line,
wherein a first dam located at an outermost side comprises a multilayer structure, the multilayer structure comprising a lowermost layer, and the lowermost layer is above the power supply line,
wherein the lowermost layer and the second insulating layer comprise a same material,
wherein the multilayer structure of the first dam comprises an uppermost layer,
wherein the power supply line is between the lowermost layer of the first dam and an inorganic insulating layer, the inorganic insulating layer being between the substrate and the first insulating layer, and
wherein an entire bottom surface of the lowermost layer contacts the power supply line.

2. The display device of claim 1, wherein the first dam is between the display area of the substrate and a terminal portion in the peripheral area.

3. The display device of claim 1, further comprising:
a pixel electrode on the second insulating layer, the pixel electrode being coupled to the thin film transistor;
a third insulating layer on the second insulating layer, the third insulating layer covering an edge of the pixel electrode; and
a spacer on the third insulating layer, the spacer being around the pixel electrode.

4. The display device of claim 3, wherein the first dam comprises:
a first layer, wherein the first layer is the lowermost layer;
a second layer on the first layer; and
a third layer on the second layer, wherein
the second layer and the third insulating layer comprise a same material; and
the third layer and the spacer comprise a same material.

5. The display device of claim 4, wherein each of the first layer and the second layer of the first dam comprises a step.

6. The display device of claim 4, wherein a thickness of the first layer of the first dam is less than a thickness of the second insulating layer.

7. The display device of claim 3, wherein the at least one dam further comprises a second dam between the first dam and the display area,
wherein a height of the first dam is greater than a height of the second dam.

8. The display device of claim 7, wherein the second dam comprises:
a first layer comprising a same material as the second insulating layer; and a second layer on the first layer, the second layer comprising a same material as the third insulating layer.

9. The display device of claim 7, wherein the second dam comprises:
a first layer comprising a same material as the third insulating layer; and
a second layer on the first layer, the second layer comprising a same material as the spacer.

10. The display device of claim 7, wherein the at least one dam further comprises a third dam between the second dam and the display area.

11. The display device of claim 1, further comprising an inorganic insulating layer between the substrate and the first insulating layer in the display area, the inorganic insulating layer extending toward and being in the peripheral area,
wherein the peripheral area comprises a first sub-peripheral area adjacent the display area, and a second sub-peripheral area outside the first sub-peripheral area,
wherein the first insulating layer and the second insulating layer of the display area extend in to the first sub-peripheral area, and
wherein the power supply line is between the first insulating layer and the second insulating layer in the first sub-peripheral area, and between the inorganic insulating layer and the first dam in the second sub-peripheral area.

12. A display device comprising:
a substrate comprising a display area and a peripheral area surrounding the display area;
a thin film transistor in the display area of the substrate;
a first insulating layer on the substrate, the first insulating layer covering the thin film transistor;
a signal line on the first insulating layer, the signal line being coupled to the thin film transistor;
a second insulating layer on the first insulating layer, the second insulating layer covering the signal line and comprising an organic insulating material;
a power supply line in the peripheral area of the substrate, the power supply line configured to supply power to a pixel circuit comprising the thin film transistor; and
a first dam located at an outermost side and comprising a plurality of layers on the power supply line, the first dam overlapping at least a part of the power supply line,
wherein a top surface of at least one of the plurality of layers comprises a step, and the first dam comprises a step based on the step of the top surface of the at least one step of the plurality of layers, and
wherein the plurality of layers of the first dam comprises a lowermost layer, and a thickness of a thickest portion of the lowermost layer is less than a thickness of a thickest portion of the second insulating layer.

13. The display device of claim 12, wherein the first dam is in upper, lower, left, and right sides of the display area.

14. The display device of claim 12, further comprising an inorganic insulating layer between the substrate and the first insulating layer in the display area, the inorganic insulating layer extending toward and being in the peripheral area,
wherein the peripheral area comprises a first sub-peripheral area adjacent the display area, and a second sub-peripheral area outside the first sub-peripheral area,
wherein the first insulating layer and the second insulating layer of the display area extend in to the first sub-peripheral area, and
wherein the power supply line is between the first insulating layer and the second insulating layer in the first sub-peripheral area, and between the inorganic insulating layer and the first dam in the second sub-peripheral area.

15. The display device of claim 12, further comprising:
a pixel electrode on the second insulating layer, the pixel electrode being coupled to the thin film transistor;
a third insulating layer on the second insulating layer, the third insulating layer covering an edge of the pixel electrode; and
a spacer on the third insulating layer, the spacer being around the pixel electrode.

16. The display device of claim 15, wherein the first dam comprises:
the lowermost layer comprising a same material as the second insulating layer;
a second layer on the lowermost layer, the second layer comprising a same material as the third insulating layer; and
a third layer on the second layer, the third layer comprising a same material as the spacer.

17. The display device of claim 15, further comprising an inorganic insulating layer between the substrate and the first insulating layer in the display area, the inorganic insulating layer extending toward and being in the peripheral area,
wherein the peripheral area comprises a first sub-peripheral area adjacent the display area, and a second sub-peripheral area outside the first sub-peripheral area,
wherein the first insulating layer and the second insulating layer of the display area extend in to the first sub-peripheral area, and
wherein the power supply line is between the first insulating layer and the second insulating layer in the first sub-peripheral area, and between the inorganic insulating layer and the first dam in the second sub-peripheral area.

18. The display device of claim 17, further comprising:
a voltage line between the power supply line and the inorganic insulating layer in the second sub-peripheral area; and
an auxiliary line on the second insulating layer in the first sub-peripheral area and on the power supply line in the second sub-peripheral area.

19. The display device of claim 12, further comprising a second dam between the first dam and the display area,
wherein a height of the first dam is greater than a height of the second dam.

20. The display device of claim 19, further comprising a third dam between the second dam and the display area,
wherein the height of the first dam is greater than a height of the third dam.

21. The display device of claim 20, wherein the peripheral area comprises a first sub-peripheral area adjacent the display area, and a second sub-peripheral area outside the first sub-peripheral area,
wherein the first insulating layer and the second insulating layer of the display area extend in to the first sub-peripheral area,
wherein the first dam and the second dam are on an inorganic insulating layer on the substrate in the second sub-peripheral area, and
wherein the third dam is on the second insulating layer in the first sub-peripheral area.

22. The display device of claim 21, further comprising:
a voltage line between the power supply line and the inorganic insulating layer in the second sub-peripheral area; and an auxiliary line on the second insulating layer in the first sub-peripheral area and on the power supply line in the second sub-peripheral area.

\* \* \* \* \*